US012765192B2

(12) United States Patent
Jin et al.

(10) Patent No.: US 12,765,192 B2
(45) Date of Patent: Oct. 13, 2026

(54) DISPLAY DEVICE

(71) Applicant: Samsung Display Co., LTD., Yongin-si (KR)

(72) Inventors: Jeongoh Jin, Yongin-si (KR); Hyungjun An, Yongin-si (KR); Minji Lee, Yongin-si (KR); Jiphyo Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 352 days.

(21) Appl. No.: 18/631,112

(22) Filed: Apr. 10, 2024

(65) Prior Publication Data

US 2025/0008785 A1 Jan. 2, 2025

(30) Foreign Application Priority Data

Jun. 27, 2023 (KR) ........................ 10-2023-0082929

(51) Int. Cl.
*H10K 59/126* (2023.01)
*H10K 59/40* (2023.01)

(52) U.S. Cl.
CPC ........... *H10K 59/126* (2023.02); *H10K 59/40* (2023.02)

(58) Field of Classification Search
CPC .... H10K 59/126; H10K 59/40; H10K 59/131; H10K 77/111; H10K 59/1213; H10K 59/123; H10K 59/124; H10K 59/805; G02F 1/133305; G06F 3/041; G09F 9/301
USPC ............................................................ 257/91
See application file for complete search history.

(56) References Cited

U.S. PATENT DOCUMENTS

| | | | | |
|---|---|---|---|---|
| 9,961,773 | B2 | 5/2018 | Choi | |
| 2017/0047357 | A1 * | 2/2017 | Kwak | H10D 86/443 |
| 2018/0012551 | A1 * | 1/2018 | Lee | G09G 3/3225 |
| 2021/0303121 | A1 * | 9/2021 | Ku | G06F 3/04164 |

FOREIGN PATENT DOCUMENTS

| | | | |
|---|---|---|---|
| KR | 20060125074 | A | 12/2006 |
| KR | 101426376 | B1 | 8/2014 |
| KR | 102367317 | B1 | 2/2022 |

* cited by examiner

*Primary Examiner* — Tong-Ho Kim
(74) *Attorney, Agent, or Firm* — CANTOR COLBURN LLP

(57) ABSTRACT

A display device includes a display panel containing a base layer having a first region having an active region, a second region bent about a bending axis, and a third region, a pixel overlapping the active region, a shielding part disposed in the second region, and pads disposed in the third region, an input sensor disposed on the display panel and containing sensing electrodes and a ground part, and a flexible circuit film connected to the pads, wherein the ground part is connected to a ground pad among the pads, and the shielding part includes a pattern part exposed to the outside and a connection part connected to the pattern part and the ground pad.

20 Claims, 15 Drawing Sheets

DISPLAY DEVICE

This application claims priority to Korean Patent Application No. 10-2023-0082929, filed on Jun. 27, 2023, and all the benefits accruing therefrom under 35 U.S.C. § 119, the content of which in its entirety is herein incorporated by reference.

BACKGROUND

1. Field

The present invention relates to a display device, and more particularly, to a display device having an improved electrostatic shielding function.

2. Description of Related Art

Various display devices are being developed to be used for multimedia apparatuses such as a television, a mobile phone, a tablet computer, a navigation system, and a game console. In particular, recent development of display devices having flexible display members capable of folding or rolling is in progress for easy portability and improvement of user convenience. A resin may be applied to a bent portion of a display panel in order to prevent the inflow of static electricity.

SUMMARY

The present disclosure describes a display panel in which static electricity is prevented from flowing into the display panel through a bent portion of the display panel.

An embodiment of the invention provides a display device including a display panel containing a base layer having a first region having an active region, a second region bent about a bending axis, and a third region spaced apart from the first region with the second region disposed therebetween, a pixel overlapping the active region, a shielding part disposed in the second region, and pads disposed in the third region. The display device further includes an input sensor disposed on the display panel and including sensing electrodes overlapping the active region and a ground part disposed in a peripheral region to be adjacent to the active region, and a flexible circuit film connected to the pads, wherein the ground part is connected to a ground pad among the pads, and where the shielding part includes a pattern part exposed to the outside and a connection part connected to the pattern part and the ground pad.

In an embodiment, the display panel may further include a cover part in which an opening exposing the pattern part is defined, and which is disposed in the second region to cover the pattern part, where the cover part may include an organic material.

In an embodiment, the display panel may include a ground line which is disposed in the first region to the third region, and which has one end connected to the ground part through a contact hole defined in the first region and the other end connected to the ground pad, where the ground part may be connected to the ground pad through the ground line.

In an embodiment, the connection part may be connected to the ground pad through the ground line.

In an embodiment, the display panel may include a data line disposed in the first region to the third region, and connected to the pixel and a pixel pad among the pads, where the connection part may cross the data line on a plane.

In an embodiment, the shielding part may further include a connection pattern disposed on a different layer from a layer on which the connection part is disposed, and overlapping a place at which the data line and the connection part cross each other, where the connection part may be disconnected at a place where the connection part crosses the data line, and portions, of the connection part, disconnected and spaced apart from each other with the data line therebetween may be connected by the connection pattern.

In an embodiment, each of the pads may include a first pattern and a second pattern disposed on the first pattern and in contact with the flexible circuit film.

In an embodiment, the shielding part may be disposed on a same layer as a layer on which the first pattern is disposed.

In an embodiment, the shielding part may be disposed on a same layer as a layer on which the second pattern is disposed.

In an embodiment, the input sensor may include a first sensing insulation layer directly disposed on the display panel, a first conductive layer disposed on the first sensing insulation layer and constituting a part of the sensing electrodes, a second sensing insulation layer covering the first conductive layer and disposed on the first sensing insulation layer, and a second conductive layer disposed on the second sensing insulation layer and constituting a remaining part of the sensing electrodes.

In an embodiment, the shielding part may include a same material as that of the second conductive layer, and the connection part may be connected to the ground line by passing through at least one of the first sensing insulation layer or the second sensing insulation layer.

In an embodiment, the pattern part may be provided in plurality, and the connection part may be connected to each of the pattern parts, wherein each of the pattern parts are spaced apart from each other.

In an embodiment, the display panel may further include a driving chip disposed in the third region, where the driving chip may be disposed between the pads and the pattern parts on a plane.

In an embodiment, the driving chip may be connected to a driving ground pad among the pads, and the connection part may be connected to the driving ground pad.

In an embodiment, the display panel may further include an alignment mark disposed in the first region and containing a conductive material.

In an embodiment, the connection part may be connected to the alignment mark.

In an embodiment, the pixel may include a semiconductor pattern, a control electrode overlapping the semiconductor pattern, an upper electrode overlapping the control electrode, a transistor including a source and a drain connected to the semiconductor pattern, and a light-emitting element connected to the transistor, where the display panel may include a barrier layer disposed on the base layer, a buffer layer disposed on the barrier layer, a first insulation layer disposed on the buffer layer and covering the semiconductor pattern, a second insulation layer disposed on the first insulation layer and covering the control electrode, a third insulation layer disposed on the second insulation layer and covering the upper electrode, a fourth insulation layer disposed on the third insulation layer and having the source and the drain disposed therein, a fifth insulation layer disposed on the fourth insulation layer and covering the source and the drain, and a sixth insulation layer disposed on the fifth insulation layer.

In an embodiment, the display panel may further include a connection electrode connected to the source and the light-emitting element through a contact hole defined in the fifth insulation layer, and covered by the sixth insulation layer.

In an embodiment, a groove, passing through the first to the fourth insulation layers to expose the base layer, may be defined in the second region, and the fifth insulation layer may be disposed on the groove.

In an embodiment, the shielding part may be covered by the sixth insulation layer.

BRIEF DESCRIPTION OF THE FIGURES

The accompanying drawings are included to provide an understanding of the invention, and are incorporated in and constitute a part of this specification. The drawings illustrate embodiments of the invention and, together with the description, serve to explain principles of the invention. In the drawings.

DETAILED DESCRIPTION

Figure 1:
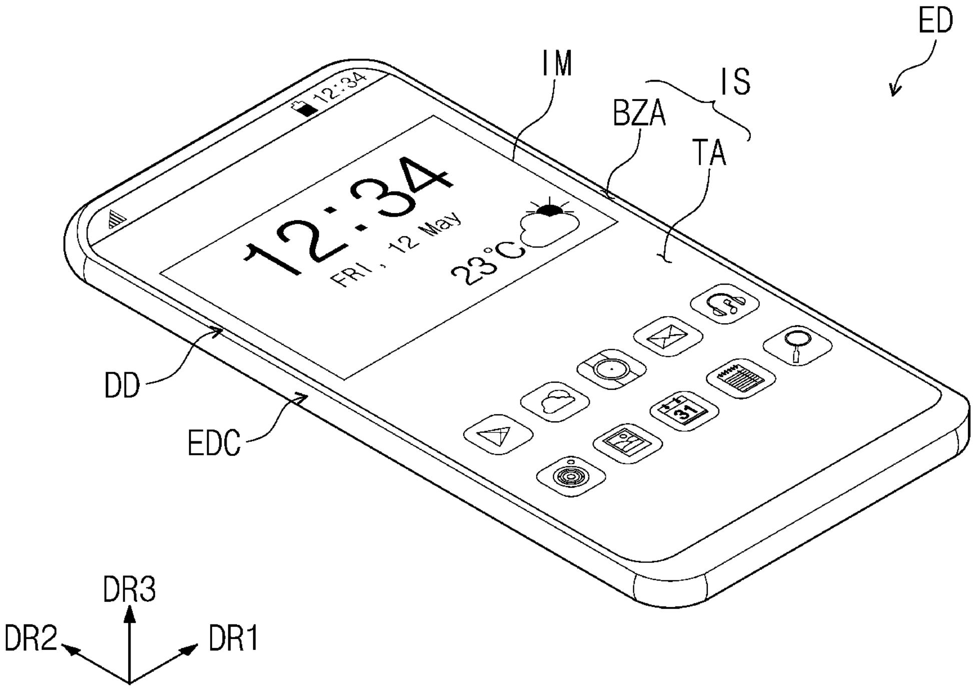
FIG. 1 is a perspective view of a display device, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (or a region, a layer, a portion, or the like) is referred to as being "on", "connected to", "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the invention. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the invention are described with reference to the accompanying drawings.

Figure 2:
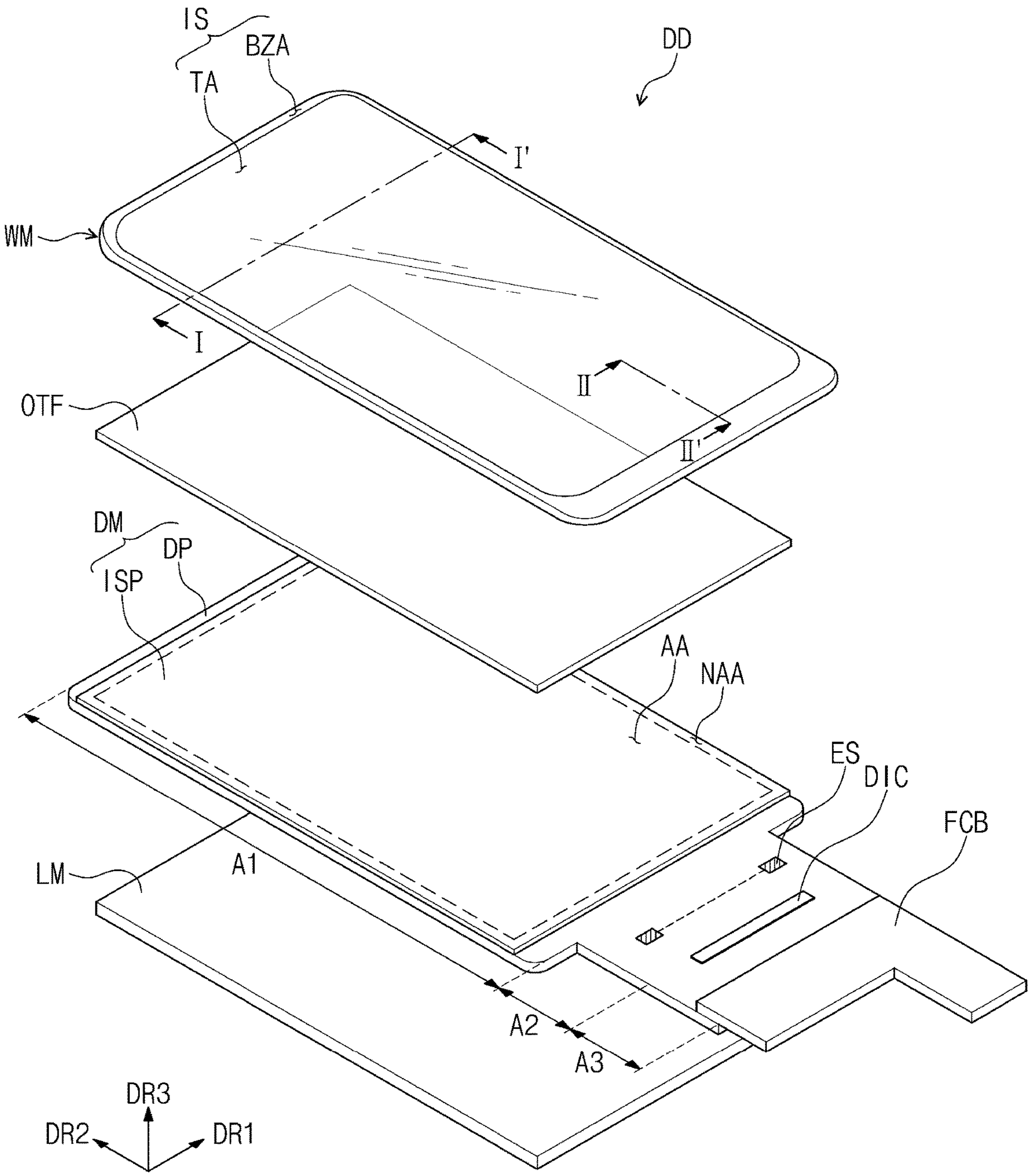
FIG. 2 is an exploded perspective view of a display device, according to an embodiment.
Figure 3:
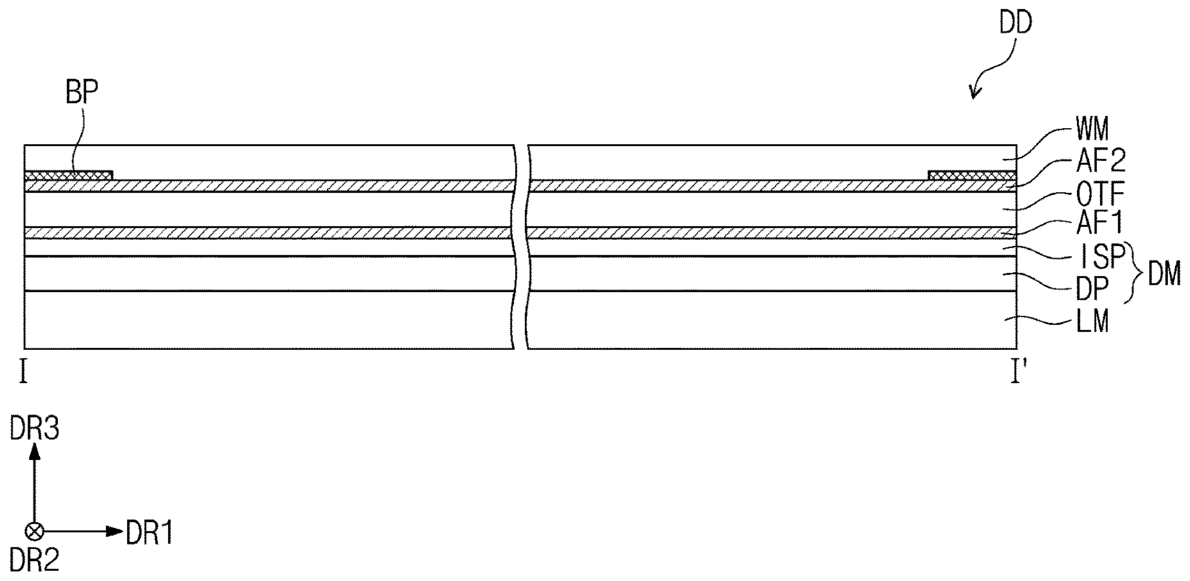
FIG. 3 is a cross-sectional view of the display device of FIG. 2 taken along line I-I' of FIG. 2, according to an embodiment.

FIG. 1 is a perspective view of a display device, according to an embodiment. FIG. 2 is an exploded perspective view of a display device, according to an embodiment. FIG. 3 is a cross-sectional view taken along line I-I' of FIG. 2, according to an embodiment.

In an embodiment and referring to FIGS. 1 to 3, an electronic device ED may be activated in response to electrical signals. The electronic device ED may include various embodiments. For example, the electronic device ED may be a display device such as a smart watch, a tablet computer, a laptop computer, a computer, a smart television, etc.

In an embodiment, the electronic device ED may display an image IM on a display surface IS that is directed parallel to each of a first direction DR1 and a second direction DR2 toward a third direction DR3. The display surface IS on which the image IM is displayed may correspond to a front surface of the electronic device ED. The image IM may include a still image as well as a dynamic image.

In an embodiment, a front surface (or upper surface) and a rear surface (or lower surface) of each of the members are defined on the basis of the third direction DR3 in which the image IM is displayed. The front surface and the rear surface may be disposed to be opposed to each other in the third direction DR3, and the normal direction of each of the front surface and the rear surface may be parallel to the third direction DR3.

In an embodiment, a distance between the front surface and the rear surface in the third direction DR3 may correspond to the thickness of the electronic device ED in the third direction DR3. Meanwhile, directions indicated by the first to third directions DR1, DR2, and DR3, respectively, may be relative concepts and may thus be changed to other directions.

In an embodiment, the electronic device ED may detect an external input applied from the outside. The external input may include various types of inputs provided from the outside of the electronic device ED. For example, the external input may include not only an external input applied by contact with a part of a user's body such as a hand, but also an external input applied in close proximity to the electronic device ED, or applied adjacent to the electronic device ED at a predetermined distance (for example, hovering). In addition, the external input may include various forms such as power, pressure, temperature, and light.

In an embodiment, the display surface IS of the electronic device ED may be divided into a transmission region TA and a bezel region BZA. The transmission region TA may be a region in which the image IM is displayed. A user views the image IM through the transmission region TA. In an embodiment, the transmission region TA is illustrated as a quadrilateral shape with rounded corners. However, the transmission region TA may have various shapes, and is not limited to any one embodiment.

In an embodiment, the bezel region BZA is disposed adjacent to the transmission region TA. The bezel region BZA may have a predetermined color. The bezel region BZA may surround the transmission region TA. Accordingly, the shape of the transmission region TA may be substantially defined by the bezel region BZA. However, in another embodiment, the bezel region BZA may be disposed adjacent only to one side of the transmission region TA, or may also be omitted. The electronic device ED may include various embodiments, and is not limited to any one embodiment.

In an embodiment, the electronic device ED may include a display device DD and an outer case EDC. The display device DD may include a window WM, a display module DM, a driving module EM, an optical film OTF, and a lower module LM. A display panel DP generates the image IM, and an input sensor ISP acquires coordinate information on the external input (for example, a touch event).

In an embodiment, the window WM may be formed of a transparent material capable of projecting the image. For example, the window WM may include glass, sapphire, plastic, etc. The window WM is illustrated as a single layer, but is not limited thereto, and may include a plurality of layers. Meanwhile, although not illustrated in the drawing, the bezel region BZA of the display device DD, previously described, may be substantially provided as a region printed on one region of the window WM with a material having a predetermined color.

In an embodiment, the display module DM may include the display panel DP and the input sensor ISP. The display panel DP according to an embodiment may be an emission-type display panel, but is not particularly limited thereto. For example, the display panel DP may be an organic light-emitting display panel, an inorganic light-emitting display panel, or a quantum-dot light-emitting display panel. A light-emitting layer of the organic light-emitting display panel may include an organic light-emitting material, and a light-emitting layer of the inorganic light-emitting display panel may include an inorganic light-emitting material. A light-emitting layer of the quantum-dot light-emitting display panel may include quantum dots, quantum rods, and the like. Hereinafter, the display panel DP is described as the organic light-emitting display panel.

In an embodiment, the input sensor ISP may be directly disposed on the display panel DP. According to an embodiment, the input sensor ISP may be formed on the display panel DP through a continuous process. That is, when the input sensor ISP is directly disposed on the display panel DP, an adhesive film for bonding the input sensor ISP to the display panel DP is not disposed between the input sensor ISP and the display panel DP.

In an embodiment, the optical film OTF reduces the reflectance for external light incident from above the window WM. The optical film OTF, according to an embodiment, may include a retarder and a polarizer. The retarder may be a film type or a liquid crystal coating type, and include a ë/2 retarder and/or ë/4 retarder. The polarizer may also be a film type or a liquid crystal coating type. The film type may include a stretchable synthetic resin film, and the liquid crystal coating type may include liquid crystals arranged in a predetermined arrangement. The retarder and the polarizer may be provided as one polarizing film. The optical film OTF may further include a protection film disposed above or under the polarizing film.

In an embodiment, the optical film OTF may be disposed on the input sensor ISP. That is, the optical film OTF may be disposed between the input sensor ISP and the window WM. The input sensor ISP, the optical film OTF, and the window WM may be bonded to each other through an adhesive layer. Referring to FIG. 3, a window adhesive layer AF1 is disposed between the input sensor ISP and the optical film OTF, and an optical adhesive layer is disposed between the optical film OTF and the window WM. Therefore, the optical film OTF is bonded to the input sensor ISP by the window adhesive layer AF1, and the window WM is bonded to the optical film OTF by the optical adhesive layer.

According to an embodiment, the adhesive layers AF1 and AF2 may each include an optically clear adhesive film (OCA). However, the material of each of the adhesive layers AF1 and AF2 is not limited thereto, and a general adhesive or gluing agent may be included. For example, the adhesive layers AF1 and AF2 may each include a pressure sensitive adhesive (PSA), an optical clear adhesive (OCA), or an optical clear resin (OCR).

In an embodiment, in addition to the optical film OTF, a functional layer for performing another function, for example, a protection layer, may further be disposed between the display module DM and the window WM.

In an embodiment, the display module DM may display the image in response to electrical signals, and transmit/receive information on the external input. The display module DM may be defined as an active region AA and a peripheral region NAA. The active region AA may be defined as a region that projects the image provided from the display module DM.

In an embodiment, the peripheral region NAA is disposed adjacent to the active region AA. For example, the peripheral region NAA may surround the active region AA. However, this is exemplarily illustrated and the peripheral region NAA may be defined in various shapes and is not limited to any one embodiment. According to an embodiment, the active region AA of the display module DM may correspond to at least a portion of the transmission region TA.

According to an embodiment, the display module DM may include a first region A1, a second region A2, and a third region A3 arranged in the second direction DR2. The first region A1 may include the active region AA and a portion of the peripheral region NAA, and the second region A2 and the third region A3 may include the rest of the peripheral region NAA. The second region A2 may be a bending region which is bent about a bending axis, and the first region A1 and the third region A3 may be non-bending regions.

In an embodiment, the length of each of the second region A2 and the third region A3 in the first direction DR1 may be smaller than or equal to the length of the first region A1 in the first direction DR1. A short region on the bending axis direction may be bent more easily.

In an embodiment, the display module DM may include a shielding part ES disposed in the second region A2. When the second region A2 is bent, the shielding part ES may block static electricity from flowing into the display panel DP through the bent region. This will be described later.

In an embodiment, the driving module EM may control operations of the display module DM. The driving module EM may include a flexible circuit film FCB and a driving chip DIC. The flexible circuit film FCB may be electrically connected to the display panel DP. The flexible circuit film FCB may be bonded to an end of the third region A3 of the display module DM through a bonding process. The flexible circuit film FCB may be electrically connected to the display module DM through an anisotropy conductive adhesive layer. The driving chip DIC may be mounted on the third region A3 of the display module DM. The driving chip DIC may include driving circuits, for example, a data driving circuit, for driving a pixel of the display panel DP.

According to an embodiment, the flexible circuit film FCB may include a ground line for discharging static electricity flowed into the flexible circuit film FCB or static electricity flowed into the input sensor ISP.

In an embodiment, the driving module EM may further include a plurality of driving elements mounted on the flexible circuit film FCB. The plurality of driving elements may include a circuit part for converting signals input from the outside into signals necessary for the driving chip DIC, or converting into signals necessary for driving the display module DM. When the second region A2 and the third region A3 of the display module DM are bent, the flexible circuit film FCB may be disposed under the display module DM.

In an embodiment, the lower module LM is disposed on a rear surface of the display module DM. Since the lower module LM is disposed on the rear surface of the display module DM, impact resistance of the display device DD may be improved. The lower module LM may be fixed onto the rear surface of the display module DM through an adhesive layer.

In an embodiment, when the second region A2 and the third region A3 of the display module DM are bent, the third region A3 of the display module DM and the flexible circuit film FCB may be disposed on a back surface of the lower module LM.

In an embodiment, the outer case EDC may be coupled to the window WM to define the exterior of the electronic device ED. The outer case EDC accommodates the display device DD. The outer case EDC absorbs external impact and prevents foreign substances/moisture, etc. from permeating the electronic device ED, and thus protects components accommodated in the outer case EDC. Meanwhile, in an embodiment, the outer case EDC may be provided in the form in which a plurality of accommodating members are coupled to each other.

Figure 4:
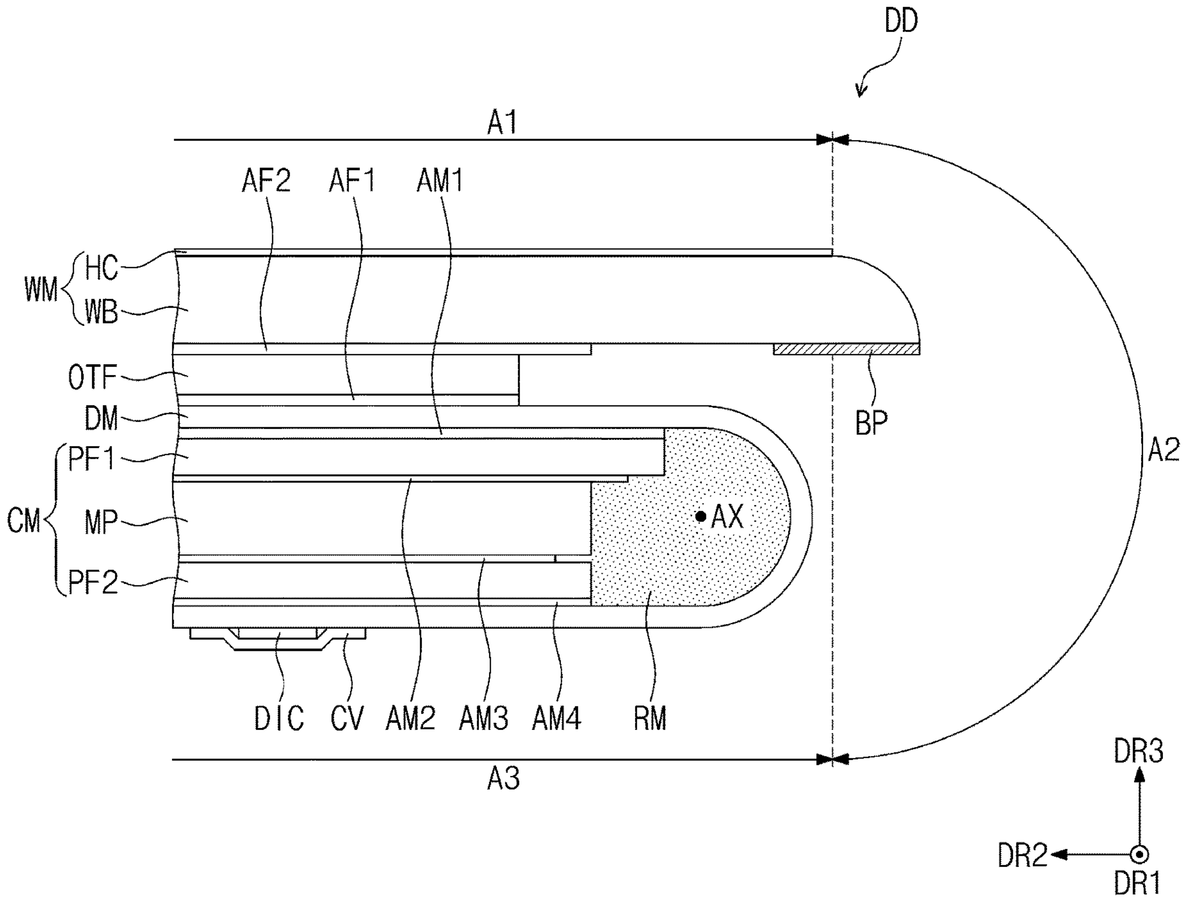
FIG. 4 is a cross-sectional view illustrating a bent display panel of a display device, according to an embodiment.

FIG. 4 is a cross-sectional view illustrating a bent display panel of a display device, according to an embodiment. FIG. 4 is a cross-sectional view illustrating a portion of a display device DD disposed adjacent to a second region A2 in a state where the second region A2 is bent about a bending axis AX extending along a first direction DR1, according to an embodiment.

In an embodiment, the display device DD may include a window WM, an optical film OTF, a display module DM, and a lower module LM. The lower module LM may include a first protection member PF1, a second protection member PF2, and a functional layer MP.

The window WM, according to an embodiment, may include a base part WB, a hard-coating layer HC, and a bezel pattern BP. The base part WB may include an optically transparent insulating material. For example, the base part WB may include a glass substrate or a synthetic resin film. The hard-coating layer HC may be disposed on either of a front surface or a rear surface of the base part WB for protecting the base part WB. The hard-coating layer HC may prevent the base part WB from being damaged by scratches, etc. In addition, an anti-fingerprint layer may further be disposed on the base part WB.

In an embodiment, the bezel pattern BP defines the bezel region BZA (see FIG. 1) of the window WM. The bezel pattern BP may be disposed adjacent to an edge of the rear surface of the base part WB.

In an embodiment, the bezel pattern BP, which is a colored layer, may be formed by coating. The bezel pattern BP may include a polymer resin and a pigment mixed in the polymer resin. The polymer resin may be, for example, an acrylate-based resin or polyester, and the pigment may be a carbon-based pigment.

According to an embodiment, an edge of either of the front surface or the rear surface of the base part WB may have a chamfered shape. For example, the edge of the front surface of the base part WB may have a rounded shape.

In an embodiment, the optical film OTF may be disposed under the window WM. The optical film OTF may reduce the reflectance for external light incident from the window WM. The window WM and the optical film OTF may be bonded to each other through a window adhesive layer AF1. The display module DM and the optical film OTF may be bonded to each other through an optical adhesive layer AF2.

In an embodiment, the first protection member PF1 may be disposed on a rear surface of the display module DM overlapping the first region A1. The display module DM and the first protection member PF1 may be bonded to each other through a first adhesive layer AM1.

In an embodiment, the functional layer MP may be disposed under the first protection member PF1. The functional layer MP and the first protection member PF1 may be bonded to each other through a second adhesive layer AM2. The functional layer MP may be provided in the form of a plate. The functional layer MP may include a plurality of layers. For example, the functional layer MP may include a light-blocking layer, a heat dissipation layer, a cushion layer, and a plurality of adhesive layers.

In an embodiment, the light-blocking layer may serve to improve the problem that components disposed on the display module DM are reflected on the window WM through active regions AA. The light-blocking layer may include a binder and a plurality of pigment particles dispersed thereto. The pigment particles may include carbon black, etc. By including the light-blocking layer, an electronic device ED, according to an embodiment, may have improved light-shielding effect.

In an embodiment, the heat dissipation layer may effectively dissipate heat generated from the display module DM. The heat dissipation layer may include at least one of graphite, copper (Cu), or aluminum (Al) having good heat dissipation characteristics, but an embodiment of the invention is not limited thereto. The heat dissipation layer may not only improve heat dissipation characteristics, but also have electromagnetic shielding or absorbing characteristics.

In an embodiment, the cushion layer may be a synthetic resin foam. The cushion layer may include a matrix and a plurality of pores. The cushion layer may have elasticity and have a porous structure.

In an embodiment, the matrix may include a flexible material. The matrix includes a synthetic resin. For example, the matrix may include at least one of an acrylonitrile butadiene styrene copolymer (ABS), polyurethane (PU), polyethylene (PE), ethylene vinyl acetate (EVA), or polyvinyl chloride (PVC).

In an embodiment, the plurality of pores easily absorb impact applied to the cushion layer. The plurality of pores may be defined as the cushion layer has the porous structure.

According to an embodiment, at least one of the light-blocking layer, the heat dissipation layer, or the cushion layer, included in the functional layer MP, may be omitted, and the functional layer MP may be provided as a single layer, not multiple layers, but is not limited to any one embodiment.

In an embodiment, the functional layer MP and the second protection member PF2 may be bonded to each other through a third adhesive layer AM3. The second protection member PF2 may be disposed on the rear surface of the display module DM overlapping the second region A2. The display module DM and the second protection member PF2 may be bonded to each other through a fourth adhesive layer AM4.

The electronic device ED, according to an embodiment, may include a protection layer RM. The protection layer RM, when the display module DM is bent, may be disposed in an inner space defined by the rear surface of the display module DM overlapping the second region A2, a side surface of the first protection member PF1, a side surface of the functional layer MP, a side surface of the second protection member PF2, and a side surface of each of the adhesive layers AM1, AM2, AM3, and AM4.

In an embodiment, as being disposed in the inner space, the protection layer RM may support the display module DM while the display module DM is bent, so that the second region A2 stays in shape. In addition, it may be possible to prevent foreign substances, etc. from entering inside the display module DM through the second region A2. The protection layer RM, according to an embodiment, may include a resin.

The display device DD, according to an embodiment, may further include a conductive film CV disposed in the third region A3. The conductive film CV may cover a driving chip DIC to prevent static electricity introduced from the outside from damaging the driving chip DIC, and to prevent foreign substances, etc. from entering inside the driving chip DIC. In addition, it may be possible to prevent impact from being applied to the driving chip DIC.

Figure 5:
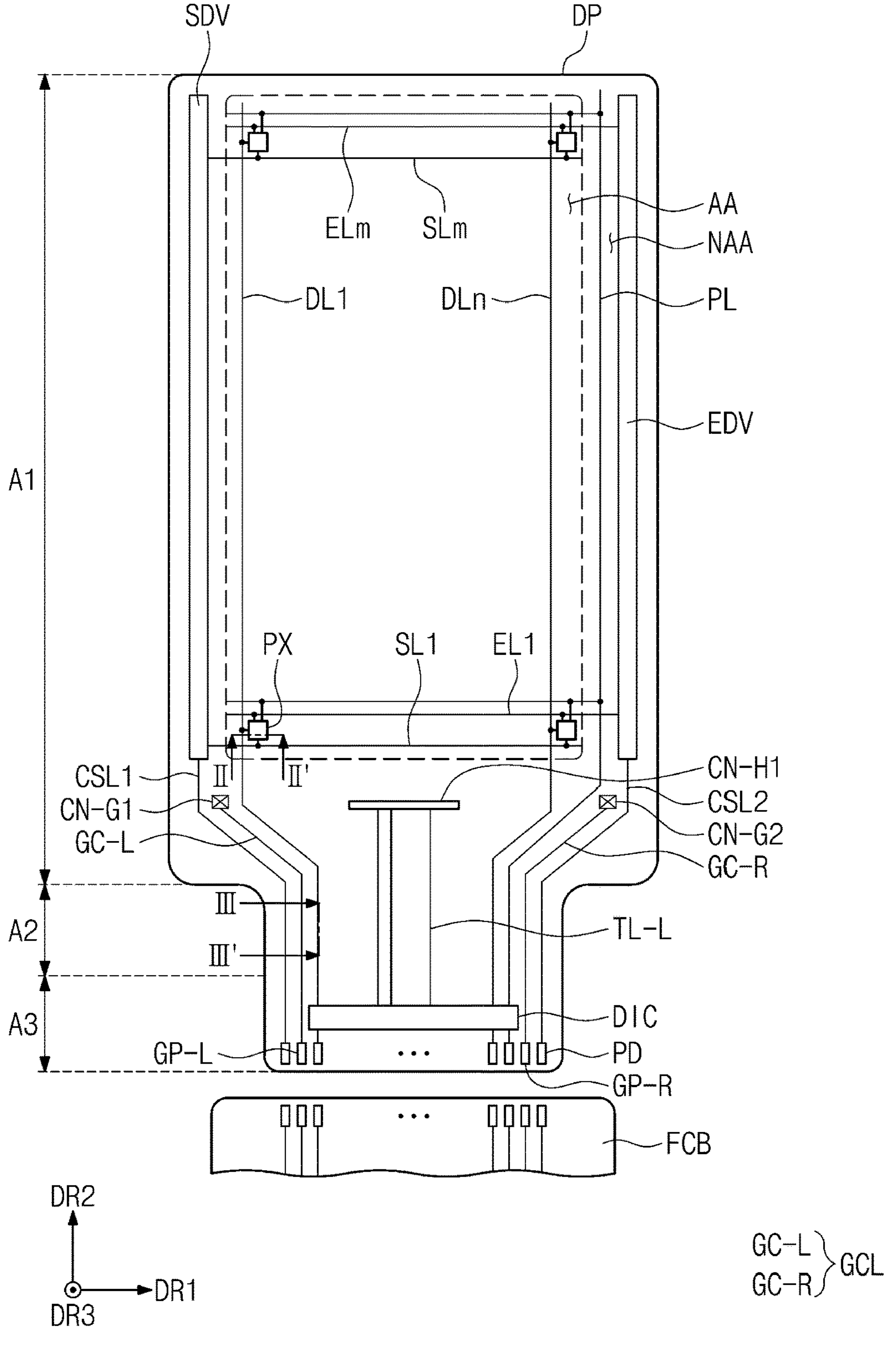
FIG. 5 is a plan view of a display panel, according to an embodiment.

FIG. 5 is a plan view of a display panel, according to an embodiment.

In FIG. 5, the shielding part ES described with reference to FIG. 2 is omitted, and this will be described later.

According to an embodiment, a display panel DP may be divided into a first region A1, a second region A2, and a third region A3 arranged along a second direction DR2. The first to third regions A1, A2, and A3, respectively, of the display panel DP illustrated in FIG. 4 correspond to the first to third regions A1, A2, and A3, respectively, of the display module DM described with reference to FIG. 2, respectively. In this specification, "a region/portion corresponding to a region/portion" refers to a region/portion overlapping a region/portion, and is not limited to the meaning of having the same area.

The display panel DP, according to an embodiment, may include an active region AA in which a pixel PX is disposed, and a peripheral region NAA adjacent to the active region AA. The active region AA and the peripheral region NAA correspond to the active region AA and the peripheral region NAA described with reference to FIG. 2, respectively. The active region AA corresponds to a region of the first region A1 where the pixel PX is disposed, the peripheral region NAA is defined as the remaining region except for the region where the pixel PX is disposed, and the peripheral region NAA includes the first region A1, the second region A2, and the third region A3.

In an embodiment, the display panel DP may include a scan driver SDV, an emission driver EDV, and a driving chip DIC in the peripheral region NAA. In an embodiment, the driving chip DIC may be a data driver.

In an embodiment, the display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, and a plurality of pads PD. Here, m and n are natural numbers. The pixels PX may be connected to the scan lines SL1 to SLm, the data lines DL1 to DLn, and the emission lines EL1 to ELm.

In an embodiment, the scan lines SL1 to SLm may extend in a first direction DR1 to be connected to the scan driver SDV. The data lines DL1 to DLn may extend from the first region A1 in the second direction DR2, via the second region A2, to be connected to the driving chip DIC disposed in the third region A3. The emission lines EL1 to ELm may extend in the first direction DR1 to be connected to the emission driver EDV.

In an embodiment, the power line PL may include a portion extending in the first direction DR1 and a portion extending in the second direction DR2. The portion extending in the first direction DR1 and the portion extending in the second direction DR2 may be disposed on different layers. The portion of the power line PL extending in the second direction DR2 may extend from the first region A1, via the second region A2, to the third region A3. The power line PL may provide a reference voltage to the pixels PX.

In an embodiment, the first control line CSL1 may be connected to the scan driver SDV, and extend from the first region A1 to the third region A3 via the second region A2. The second control line CSL2 may be connected to the emission driver EDV, and extend from the first region A1 to the third region A3 via the second region A2.

In an embodiment, the pads PD may be disposed adjacent to an end of the third region A3. The driving chip DIC, the power line PL, the first control line CSL1, and the second control line CSL2 may be connected to the pads PD. The flexible circuit film FCB may be disposed on the display panel DP while overlapping the end of the third region A3 of the display panel DP. The flexible circuit film FCB may include pads corresponding to the pads PD, and may be electrically connected to the pads PD through an anisotropic conductive film (ACF).

In this specification, among the pads PD, pads connected to the data lines DL1 to DLn may be defined as 'pixel pads', and pads connected to a ground line GCL may be defined as 'ground pads GP-L and GP-R'.

The display panel DP, according to an embodiment, may include a first contact hole CN-H1 defined in the first region A1. The display panel DP may include extending sensing lines TL-L. The extending sensing lines TL-L may extend to the third region A3 via the first region A1 and the second region A2. The extending sensing lines TL-L may be respectively connected to the corresponding sensing lines among sensing lines TL1, TL2, and TL3 (see FIG. 6), to be described later, through the first contact hole CN-H1. For example, one end of the extending sensing lines TL-L may be exposed from the first contact hole CN-H1 to be respectively connected to the sensing lines TL1, TL2, and TL3 (see FIG. 6), and the other end of the extending sensing lines TL-L may be respectively connected to the pads PD.

In an embodiment, FIG. 5 illustrates that the extending sensing lines TL-L are disposed between the data lines DL1 to DLn, but the invention is not limited thereto. The data lines DL1 to DLn may be disposed between the extending sensing lines TL-L, and accordingly, the first contact hole CN-H1 may be provided in plurality with the data lines DL1 to DLn therebetween, and the arrangement is not limited to any one embodiment.

The display panel DP, according to an embodiment, may further include a ground line GCL. The ground line GCL may include a first ground line GC-L and a second ground line GC-R. The first ground line GC-L and the second ground line GC-R may each extend from the first region A1 to the third region A3 via the second region A2.

In an embodiment, one end of the first ground line GC-L disposed in the first region A1 may be exposed by a first ground contact hole CN-G1, and the other end of the first ground line GC-L disposed in the third region A3 may be connected to a first ground pad GP-L among the pads PD. The one end of the first ground line GC-L exposed by the first ground contact hole CN-G1 may be connected to a first ground pattern GN-L (see FIG. 6) to be described later.

In an embodiment, one end of the second ground line GC-R disposed in the first region A1 may be exposed by a second ground contact hole CN-G2, and the other end of the second ground line GC-R disposed in the third region A3 may be connected to a second ground pad GP-R among the pads PD. The one end of the second ground line GC-R exposed by the second ground contact hole CN-G2 may be connected to a second ground pattern GN-R (see FIG. 6) to be described later.

Accordingly, in an embodiment, a ground part GNL (see FIG. 6) included in an input sensor ISP may be connected to the ground pads GP-L and GP-R through the ground lines GCL disposed on the display panel DP and connected to the flexible circuit film FCB.

According to an embodiment, the shielding part ES (see FIG. 2), which is disposed in the second region A2 of the display panel DP, may be included. This will be described later.

Figure 6:
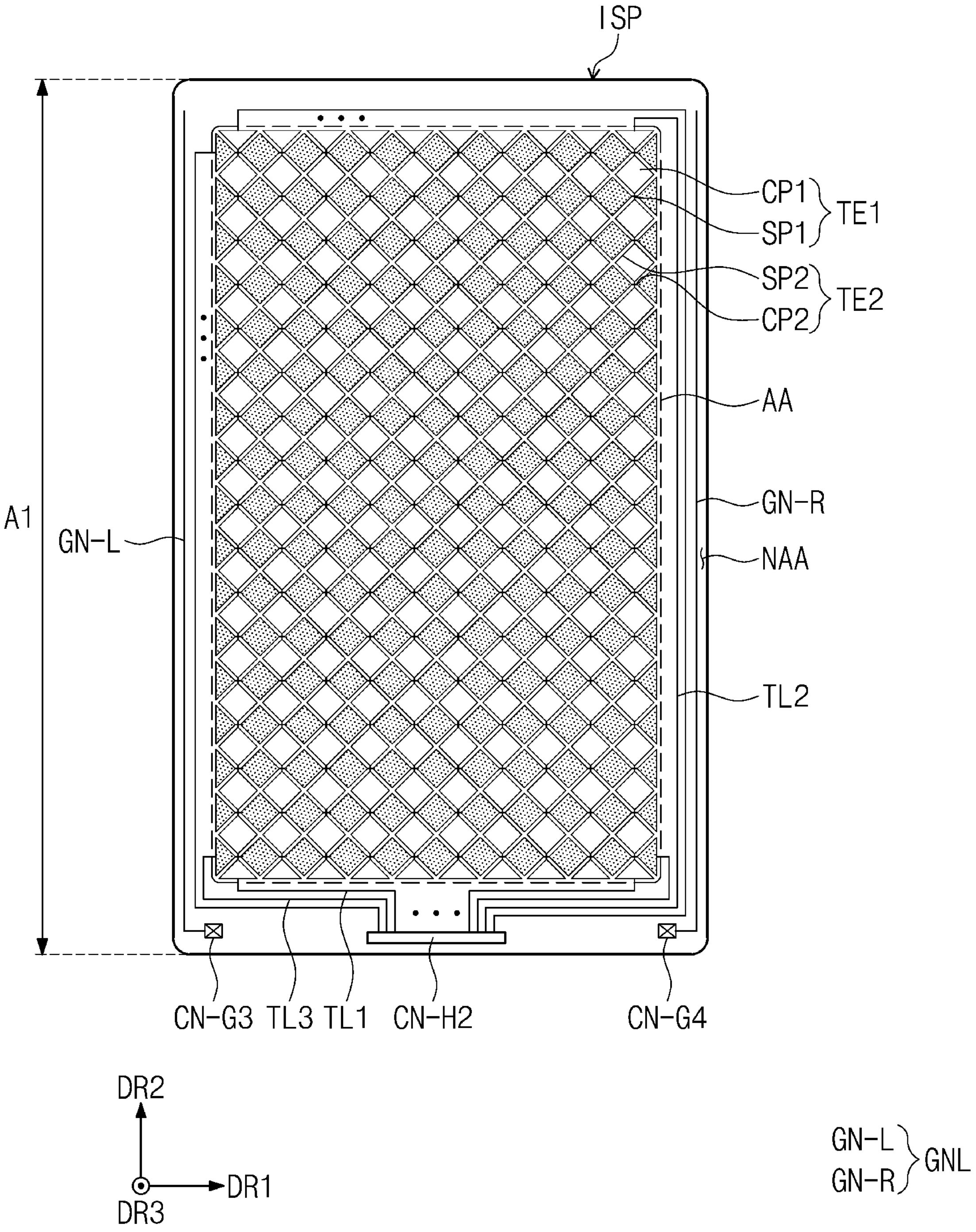
FIG. 6 is a plan view of an input sensor, according to an embodiment.

FIG. 6 is a plan view of an input sensor, according to an embodiment.

Referring to FIG. 6, an input sensor ISP, according to an embodiment, may include sensing electrodes TE1 and TE2, and sensing lines TL1, TL2, and TL3. When the input sensor ISP is directly formed on a display panel DP through a continuous process, the sensing electrodes TE1 and TE2 may be formed only in an active region AA overlapping a first region A1 of the display panel DP.

In an embodiment, the input sensor ISP may acquire information on an external input through changes in capacitance between the first sensing electrodes TE1 and the second sensing electrodes TE2. The first sensing electrodes TE1 are arranged along a first direction DR1, and each of the first sensing electrodes TE1 extend along a second direction DR2. The first sensing electrodes TE1 may each include first sensing patterns SP1 and first connection patterns CP1.

In an embodiment, the first sensing patterns SP1 are disposed in the active region AA. The first sensing patterns SP1 included in one first sensing electrode TE1 may be arranged along the second direction DR2. The first sensing patterns SP1 may have a diamond shape. However, this is exemplarily illustrated, and the first sensing patterns SP1 may have various shapes, and are not limited to any one embodiment.

In an embodiment, the first connection pattern CP1 is disposed in the active region AA. The first connection pattern CP1 may be disposed between the adjacent first sensing patterns SP1. The first connection pattern CP1 may be disposed on a layer different from a layer on which the first sensing pattern SP1 is disposed, and connected to the first sensing pattern SP1 through a contact hole.

In an embodiment, the second sensing electrodes TE2 are arranged along the second direction DR2, and each of the second sensing electrodes TE2 extends along the first direction DR1. The second sensing electrodes TE2 may each include second sensing patterns SP2 and second connection patterns CP2.

In an embodiment, the second sensing patterns SP2 may be spaced apart from the first sensing patterns SP1. The first sensing patterns SP1 and the second sensing patterns SP2 may not be in contact with each other and may transmit/receive electrical signals independently of each other.

In an embodiment, the second sensing patterns SP2 are disposed in the active region AA. The second sensing patterns SP2 included in one second sensing electrode TE2 may be arranged along the first direction DR1. The second sensing patterns SP2 may have the same shape as the shape of the first sensing pattern SP1. For example, the second sensing patterns SP2 may have a diamond shape. However, this is exemplarily illustrated, and the second sensing patterns SP2 may have various shapes, and the shape is not limited to any one embodiment.

In an embodiment, the second connection pattern CP2 may be disposed between the adjacent second sensing patterns SP2. Substantially, the second sensing patterns SP2 and the second connection patterns CP2 included in one second sensing electrode TE2 may be formed in an integral shape or in an integral pattern.

According to an embodiment, the second sensing patterns SP2, and the second connection patterns CP2 may be disposed on the same layer, and the first sensing patterns SP1 may be disposed on a different layer. The first sensing patterns SP1, the second sensing patterns SP2, and the second connection patterns CP2 may be provided as a plurality of mesh lines extending in a diagonal direction of each of the first direction DR1 and the second direction DR2.

In an embodiment, the sensing lines TL1, TL2, and TL3 are disposed in the peripheral region NAA. The sensing lines TL1, TL2, and TL3 may include first sensing lines TL1, second sensing lines TL2, and third sensing lines TL3.

In an embodiment, one end of the first sensing lines TL1 are connected to the first sensing electrodes TE1, respectively. In an embodiment, the first sensing lines TL1 are respectively connected to lower ends, among both ends, of the first sensing electrodes TE1. One end of the second sensing lines TL2 are connected to upper ends, among both ends, of the first sensing electrodes TE1, respectively. According to an embodiment, the first sensing electrodes TE1 may be connected to each of the first sensing lines TL1 and the second sensing lines TL2. Accordingly, for the first sensing electrodes TE1 which are relatively longer than the second sensing electrodes TE2, the sensitivity according to the region may be maintained uniformly.

In an embodiment, in the input sensor ISP, either of the first sensing lines TL1 or the second sensing lines TL2 may be omitted, and the input sensor ISP is not limited to any one embodiment.

In an embodiment, one end of the third sensing lines TL3 are connected to one end of the second sensing electrodes, respectively. In this embodiment, the third sensing lines TL3 are connected to left side ends, among both ends, of the second sensing electrodes TE2, respectively.

In an embodiment, a second contact hole CN-H2, which is defined by passing through at least one of the insulation layers included in the input sensor ISP, may be defined in the input sensor ISP. The second contact hole CN-H2 may overlap the first contact hole CN-H1 defined in the first region A1 of the display panel DP.

In an embodiment, the other end of the sensing lines TL1, TL2, and TL3 may each be disposed in the second contact hole CN-H2. The other end of the sensing lines TL1, TL2, and TL3 disposed in the second contact hole CN-H2 may be connected to the extending sensing lines TL-L (see FIG. 5), respectively. The sensing lines TL1, TL2, and TL3 may be connected to the pads PD (see FIG. 5) through the extending sensing lines TL-L disposed on the display panel DP (see FIG. 5).

According to an embodiment, the input sensor ISP may include a ground part GNL disposed in the peripheral region NAA. The ground part GNL may prevent static electricity applied to the input sensor ISP from entering the sensing electrodes TE1 and TE2.

In an embodiment, the ground part GNL may include a first ground pattern GN-L and a second ground pattern GN-R. The first ground pattern GN-L may be disposed in the peripheral region NAA on the left side of the active region AA, and the second ground pattern GN-R may be disposed in the peripheral region NAA on the right side of the active region AA.

In an embodiment, ground contact holes CN-G3 and CN-G4, which are defined by passing through any one of the insulation layers among the insulation layers included in the input sensor ISP, may be defined in the input sensor ISP. The ground contact holes CN-G3 and CN-G4 may include a third ground contact hole CN-G3 and a fourth ground contact hole CN-G4.

In an embodiment, the third ground contact hole CN-G3 may overlap the first ground contact hole CN-G1 (see FIG. 5) defined in the display panel DP (see FIG. 5), and the fourth ground contact hole CN-G4 may overlap the second ground contact hole CN-G2 (see FIG. 5) defined in the display panel DP (see FIG. 5).

In an embodiment, one end of the first ground pattern GN-L may be disposed on the third ground contact hole CN-G3, and connected to the first ground line GC-L (see FIG. 5) exposed by the first ground contact hole CN-G1 (see FIG. 5). Accordingly, the first ground pattern GN-L (see FIG. 5) may be connected to the first ground pad GP-L (see FIG. 5), and connected to the flexible circuit film FCB (see FIG. 5).

In an embodiment, one end of the second ground pattern GN-R may be disposed on the fourth ground contact hole CN-G4, and connected to the second ground line GC-R (see FIG. 5) exposed by the second ground contact hole CN-G2 (see FIG. 5). Accordingly, the second ground pattern GN-R (see FIG. 5) may be connected to the second ground pad GP-R (see FIG. 5), and connected to the flexible circuit film FCB (see FIG. 5).

Figure 7A:
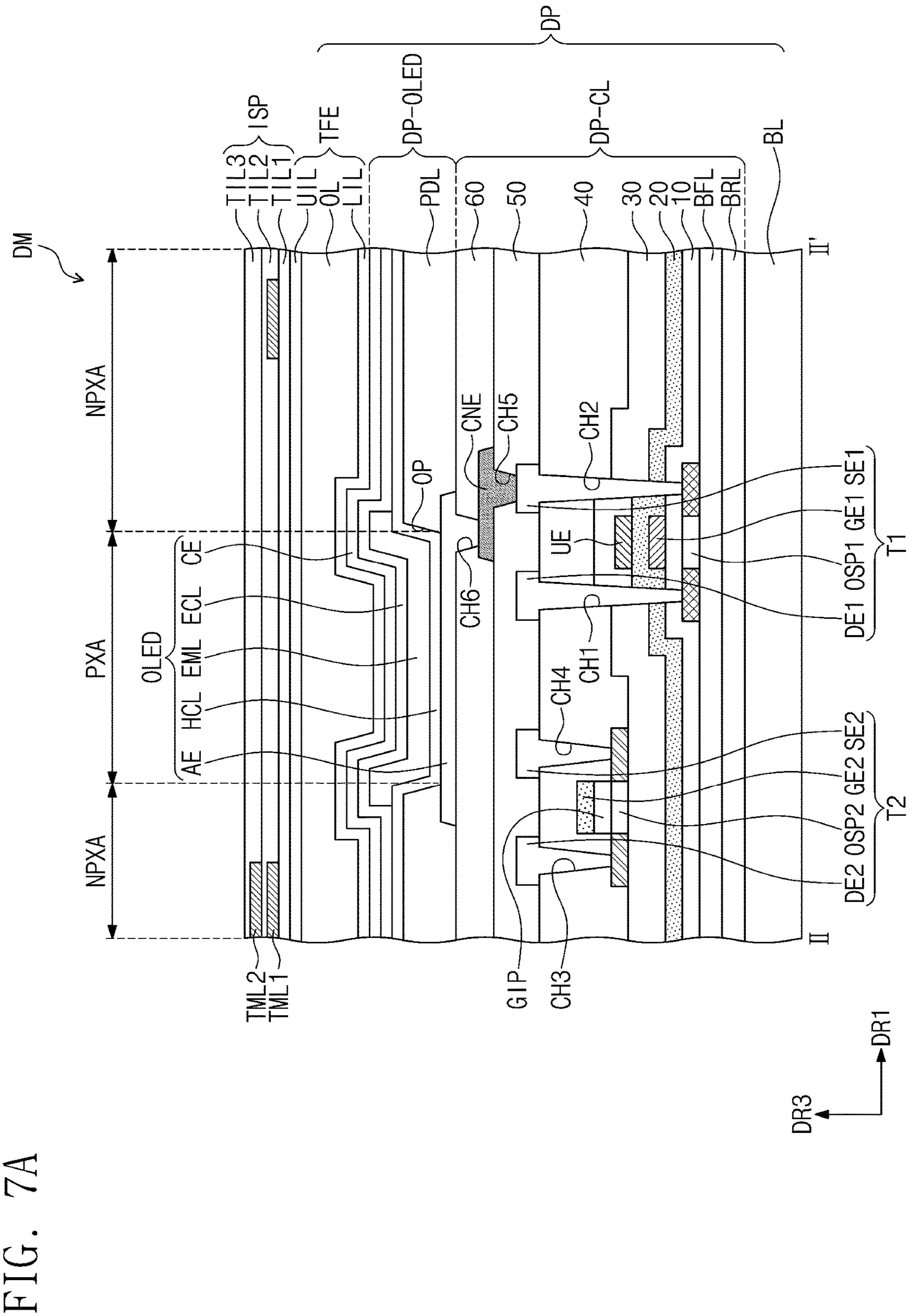
FIG. 7A is a cross-sectional view of the display panel of FIG. 5 taken along line II-II' of FIG. 5, according to an embodiment.
Figure 7B:
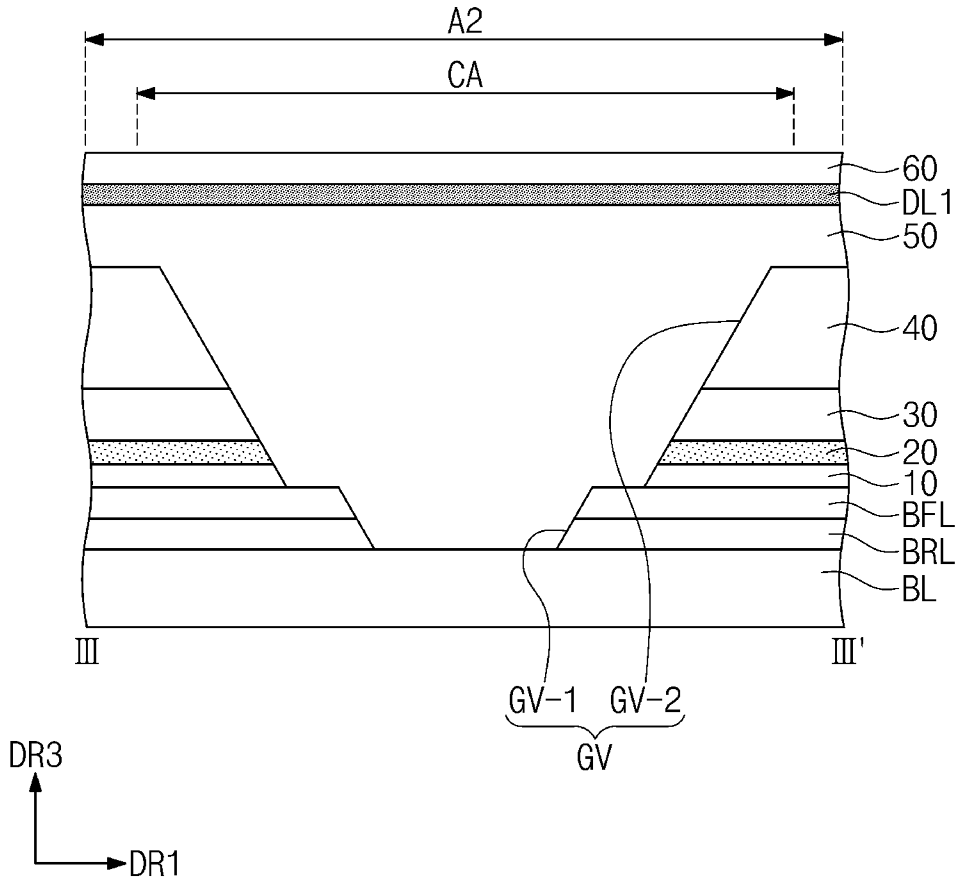
FIG. 7B is a cross-sectional view the display panel of FIG. 5 taken along line III-III' of FIG. 5, according to an embodiment.

FIG. 7A is a cross-sectional view taken along line II-II' of FIG. 5, according to an embodiment. FIG. 7B is a cross-sectional view taken along line III-III' of FIG. 5, according to an embodiment. FIG. 7A is a cross-sectional view illustrating a display device DD corresponding to line II-II' of FIG. 5, according to an embodiment.

In an embodiment, FIG. 7A illustrates a cross-section corresponding to a first thin-film transistor T1, a second thin-film transistor T2, and a light-emitting element OLED as a partial configuration of the pixel PX (see FIG. 5).

In an embodiment, the display panel DP may include a base layer BL, a circuit element layer DP-CL disposed on the base layer, a display element layer DP-OLED, and a thin-film encapsulation layer TFE. The display panel DP may further include functional layers such as an anti-reflection layer, and a refractive index control layer. The circuit element layer DP-CL includes at least a plurality of insulation layers and a circuit element. Hereinafter, the insulation layers may include an organic layer and/or inorganic layer.

In an embodiment, the circuit element includes a signal line, and a driving circuit for the pixel, etc. The circuit element layer DP-CL may be formed through forming processes of an insulation layer, a semiconductor layer, and a conductive layer by coating, deposition, etc., and through patterning processes of the insulation layer, the semiconductor layer, and the conductive layer by photolithography. The display element layer DP-OLED may include the light-emitting element OLED and a pixel-defining film PDL.

In an embodiment, the base layer BL may include a synthetic resin film. The synthetic resin layer may include a thermosetting resin. In particular, the synthetic resin layer may be a polyimide-based resin layer, and the material is not particularly limited thereto. The synthetic resin layer may include at least one of an acrylate-based resin, a methacrylate-based resin, polyisoprene, a vinyl-based resin, an epoxy-based resin, a urethane-based resin, a cellulose-based resin, a siloxane-based resin, a polyamide-based resin, or a perylene-based resin. In addition, the base layer may include a glass substrate, a metal substrate, an organic/inorganic composite material substrate, or the like.

In an embodiment, the first region A1, the second region A2, and the third region A3 may be described with reference to FIG. 2 and may be included in the base layer BL.

In an embodiment, at least one inorganic layer is formed on an upper surface of the base layer BL. The inorganic layer may include at least one of aluminum oxide, titanium oxide, silicon oxide, silicon oxynitride, zirconium oxide, or hafnium oxide. The inorganic layer may be formed in multiple layers. The multi-layer inorganic layer may include a barrier layer BRL and/or a buffer layer BFL to be described later. The barrier layer BRL and the buffer layer BFL may be selectively disposed.

In an embodiment, the barrier layer BRL prevents foreign substances from entering from the outside. The barrier layer BRL may include a silicon oxide layer and a silicon nitride layer. Each of these layers may be provided in plurality, and the silicon oxide layers and the silicon nitride layers may be alternately stacked.

In an embodiment, the buffer layer BFL may be disposed on the barrier layer BRL. The buffer layer BFL improves bonding forces between the base layer BL and conductive patterns, or semiconductor patterns. The buffer layer BFL may include a silicon oxide layer and a silicon nitride layer. The silicon oxide layer and the silicon nitride layer may be alternately stacked.

In an embodiment, a first semiconductor pattern OSP1 is disposed on the buffer layer BFL. The first semiconductor pattern OSP1 may include a silicon semiconductor. The first semiconductor pattern OSP1 may be a polysilicon semiconductor. However, an embodiment is not limited thereto, and the first semiconductor pattern OSP1 may include amorphous silicon.

In an embodiment, the first semiconductor pattern OSP1 may include an input region (or first part), an output region (or second part), and a channel region (or third part) defined between the input region and the output region. The channel region of the first semiconductor pattern OSP1 may be defined corresponding to a first control electrode GE1 to be described later. The input region and the output region are doped with dopants, and thus have relatively higher conductivity than the channel region. The input region and the output region may be doped with N-type dopants. In an embodiment, an N-type first thin-film transistor T1 is exemplarily described, but the first thin-film transistor T1 may also be a P-type transistor.

In an embodiment, a first insulation layer 10 is disposed on the buffer layer BFL. The first insulation layer 10 overlaps the plurality of pixels PX (see FIG. 2) in common, and covers the first semiconductor pattern OSP1. The first insulation layer 10 may be an inorganic layer and/or an organic layer, and may have a single-layer or multi-layer structure. The first insulation layer 10 may include at least one of aluminum oxide, titanium oxide, silicon oxide, silicon oxynitride, zirconium oxide, or hafnium oxide. In an embodiment, the first insulation layer 10 may be a single-layer silicon oxide layer.

In an embodiment, the first control electrode GE1 is disposed on the first insulation layer 10. The first control electrode GE1 overlaps the channel region of the first semiconductor pattern OSP1.

In an embodiment, t second insulation layer 20 that covers the first control electrode GE1 is disposed on the first insulation layer 10. The second insulation layer 20 overlaps the plurality of pixels PX (see FIG. 1) in common. The second insulation layer 20 may be an inorganic layer and/or an organic layer, and may have a single-layer or multi-layer structure. The second insulation layer 20 may include at least one of aluminum oxide, titanium oxide, silicon oxide, silicon oxynitride, zirconium oxide, or hafnium oxide. In an embodiment, the second insulation layer 20 may be a single-layer silicon oxide layer.

In an embodiment, an upper electrode UE may further be disposed on the second insulation layer 20. The upper electrode UE may overlap the first control electrode GE1.

In an embodiment, a third insulation layer 30 that covers the upper electrode UE is disposed on the second insulation layer 20. The third insulation layer 30 may be an inorganic layer and/or an organic layer, and may have a single-layer or multi-layer structure. The third insulation layer 30 may include at least one of aluminum oxide, titanium oxide, silicon oxide, silicon oxynitride, zirconium oxide, or hafnium oxide. In an embodiment, the third insulation layer 30 may be a single-layer silicon oxide layer.

In an embodiment, a second semiconductor pattern OSP2 is disposed on the third insulation layer 30. The second semiconductor pattern OSP2 may include an oxide semiconductor. The second semiconductor pattern OSP2 may include a crystalline or amorphous oxide semiconductor. For example, the oxide semiconductor may include an oxide of metal such as zinc (Zn), indium (In), gallium (Ga), tin (Sn), and titanium (Ti), or a mixture of metal such as zinc (Zn), indium (In), gallium (Ga), tin (Sn), and titanium (Ti), and an oxide thereof. The oxide semiconductor may include indium-tin oxide (ITO), indium-gallium-zinc oxide (IGZO), zinc oxide (ZnO), indium-zinc oxide (IZnO), zinc-indium oxide (ZIO), indium oxide (InO), titanium oxide (TiO), indium-zinc-tin oxide (IZTO), zinc-tin oxide (ZTO), etc.

In an embodiment, the second semiconductor pattern OSP2 may include an input region (or first part), an output region (or second part), and a channel region (or third part) defined between the input region and the output region. The input region and the output region may include impurities. The channel region of the second semiconductor pattern OSP2 may be defined as corresponding to a second control electrode GE2 to be described later.

In an embodiment, the impurities of the second semiconductor pattern OSP2 may be reduced metal materials. The input region and the output region may include metal materials that are reduced from metal oxides composing the channel region. Accordingly, the second thin-film transistor T2 may decrease in leakage current, and may thus serve as a switching element with improved on-off characteristics.

In an embodiment, an insulation pattern GIP is disposed on the channel region of the second semiconductor pattern OSP2. The second control electrode GE2 is disposed on the insulation pattern GIP. The second control electrode GE2 overlaps at least the insulation pattern GIP. Edges of the insulation pattern GIP may be arranged along edges of the second control electrode GE2. The second control electrode GE2 may have the same shape as the shape of the insulation pattern GIP on a plane. The second control electrode GE2 may be disposed inside the insulation pattern GIP.

In an embodiment, a fourth insulation layer 40 that covers the second semiconductor pattern OSP2 and the second control electrode GE2 is disposed on the third insulation layer 30. The fourth insulation layer 40 may be an inorganic layer and/or an organic layer, and may have a single-layer or multi-layer structure. The fourth insulation layer 40 may include at least one of aluminum oxide, titanium oxide, silicon oxide, silicon oxynitride, zirconium oxide, or hafnium oxide. In an embodiment, the fourth insulation layer 40 may include a silicon oxide layer and a silicon nitride layer. The fourth insulation layer 40 may include a plurality of silicon oxide layers and silicon nitride layers that are alternately stacked.

In an embodiment, a first input electrode DE1, a first output electrode SE1, a second input electrode DE2, and a second output electrode SE2 are disposed on the fourth insulation layer 40. The first input electrode DE1 and the first output electrode SE1 are connected to the first semiconductor pattern OSP1 through a first contact hole CH1 and a second contact hole CH2 that respectively expose the input region and the output region of the first semiconductor pattern OSP1. The first contact hole CH1 and the second contact hole CH2 pass through the first insulation layer 10, the second insulation layer 20, the third insulation layer 30 and the fourth insulation layer 40.

In an embodiment, the second input electrode DE2 and the second output electrode SE2 are connected to the second semiconductor pattern OSP2 through a third contact hole CH3 and a fourth contact hole CH4 that respectively exposes the input region and the output region of the second semiconductor pattern OSP2. The third contact hole CH3 and the fourth contact hole CH4 pass through the fourth insulation layer 40.

In an embodiment, a fifth insulation layer 50 that covers the first input electrode DE1, the first output electrode SE1, the second input electrode DE2, and the second output electrode SE2 is disposed on the fourth insulation layer 40. The fifth insulation layer 50 may be an organic layer, and may have a single-layer or multi-layer structure.

In an embodiment, a connection electrode CNE is disposed on the fifth insulation layer 50. The connection electrode CNE may be connected to the first output electrode SE1 through a fifth contact hole CH5 passing through the fifth insulation layer 50. A sixth insulation layer 60 (or passivation layer) that covers the connection electrode CNE is disposed on the fifth insulation layer 50. The sixth insulation layer 60 may be an organic layer, and may have a single-layer or multi-layer structure.

In an embodiment, the fifth insulation layer 50 and the sixth insulation layer 60 may each be a single-layer polyimide-based resin layer. An embodiment is not limited thereto, and the fifth insulation layer 50 and the sixth insulation layer 60 may each include at least one of an acrylate-based resin, a methacrylate-based resin, polyisoprene, a vinyl-based resin, an epoxy-based resin, a urethane-based resin, a cellulose-based resin, a siloxane-based resin, a polyamide-based resin, or a perylene-based resin.

In an embodiment, the light-emitting element OLED is disposed on the sixth insulation layer 60. An anode AE of the light-emitting element OLED is disposed on the sixth insulation layer 60. The anode AE is connected to the connection electrode CNE through a sixth contact hole CH6 passing through the sixth insulation layer 60. A pixel-defining film PDL is disposed on the sixth insulation layer 60.

In an embodiment, an opening OP of the pixel-defining film PDL exposes at least a portion of the anode AE. The opening OP of the pixel-defining film PDL may define a light-emitting region PXA of a pixel PX. For example, the plurality of pixels PX (see FIG. 2) may be disposed on a flat surface of the display panel DP in a certain embodiment. A region where the plurality of pixels PX are disposed may be defined as a pixel region, and one pixel region may include the light-emitting region PXA and a non-light-emitting region NPXA disposed adjacent to the light-emitting region PXA. The non-light-emitting region NPXA may surround the light-emitting region PXA.

In an embodiment, a hole control layer HCL may be disposed in the light-emitting region PXA and the non-light-emitting region NPXA in common. A common layer such as the hole control layer HCL may be formed across the plurality of pixels PX (see FIG. 2) in common. The hole control layer HCL may include a hole transport layer and a hole injection layer.

In an embodiment, an organic light-emitting layer EML is disposed on the hole control layer HCL. The organic light-emitting layer EML may be disposed only in a region corresponding to the opening OP. The organic light-emitting layer EML may be formed separately for each of the plurality of pixels PX (see FIG. 2).

In an embodiment, the patterned organic light-emitting layer EML is exemplarily illustrated, but the organic light-emitting layer EML may be disposed on the plurality of pixels PX in common. At this time, the organic light-emitting layer EML may generate white color light. In addition, the organic light-emitting layer EML may have a multi-layer structure.

In an embodiment, an electron control layer ECL is disposed on the organic light-emitting layer EML. The electron control layer ECL may include an electron transport layer and an electron injection layer. A cathode CE is disposed on the electron control layer ECL. The electron control layer ECL and the cathode CE are disposed on the plurality of pixels PX (see FIG. 2) in common.

In an embodiment, the thin-film encapsulation layer TFE is disposed on the cathode CE. The thin-film encapsulation layer TFE is disposed on the plurality of pixels PX in common. In an embodiment, the thin-film encapsulation layer TFE directly covers the cathode CE. According to an embodiment, a capping layer that covers the cathode CE may further be disposed. A stacked structure of the light-emitting element OLED, according to an embodiment, may also be a structure vertically inverted from the structure illustrated in FIG. 7A.

In an embodiment, the thin-film encapsulation layer TFE may cover the light-emitting element OLED. The thin-film encapsulation layer TFE may include two inorganic layers LIL and UIL and an organic layer OL disposed therebetween. According to an embodiment, the thin-film encapsulation layer TFE may include a plurality of inorganic layers and a plurality of organic layers that are alternately stacked.

In an embodiment, the inorganic layers LIL and UIL protect the light-emitting element OLED from moisture/oxygen, and the organic layer OL protects the light-emitting element OLED from foreign substances such as dust particles. The inorganic layers LIL and UIL may include a silicon nitride layer, a silicon oxynitride layer, a silicon oxide layer, a titanium oxide layer, an aluminum oxide layer, or the like, and the type of layers is not limited particularly thereto. The organic layer OL may include an acrylate-based organic layer, and is not particularly limited thereto.

According to an embodiment, the first thin-film transistor T1 may include a silicon semiconductor, and particularly, a polysilicon semiconductor, and may thus have high electron mobility. The second thin-film transistor T2 may include an oxide semiconductor, thereby reducing leakage current. Therefore, a driving voltage of the pixel PX (see FIG. 2) is decreased, and malfunction is prevented.

According to an embodiment, a first electrode and a second electrode of a capacitor may be formed through the same process as that of components of the first thin-film transistor T1. For example, the first electrode of the capacitor may be disposed on the first insulation layer 10. The first electrode may be formed through the same process as that of the first control electrode GE1. The first electrode may be connected to the first control electrode GE1. The second insulation layer 20 covers the first electrode. The second electrode of the capacitor may be disposed on the second insulation layer 20.

In an embodiment, the upper electrode UE may be electrically connected to the second electrode. In addition, the upper electrode UE and the second electrode of the capacitor may be formed through the same process, and may thus have an integral shape. The third insulation layer 30 that covers the second electrode, and the upper electrode UE is disposed on the second insulation layer 20.

In an embodiment, the input sensor ISP may be directly disposed on the display panel DP. The input sensor ISP may include sensing insulations TIL1, TIL2, and TIL3, and at least one of conductive layers TML1 and TML2. The sensing insulation layers TIL1, TIL2, and TIL3 may include either of an inorganic material or an organic material.

In an embodiment, a first sensing insulation layer TIL1 may be directly disposed on the second inorganic layer UIL of the thin-film encapsulation layer TFE. A first conductive layer TML1 is disposed on the first sensing insulation layer TIL1. A second sensing insulation layer TIL2 may be disposed on the first sensing insulation layer TIL1, and cover the first conductive layer TML1. A second conductive layer TML2 is disposed on the second sensing insulation layer TIL2. A third sensing insulation layer TIL3 may be disposed on the second sensing insulation layer TIL2, and covers the second conductive layer TML2. However, an embodiment is not limited thereto the first sensing insulation layer TIL1 may be omitted, and the first conductive layer TML1 may be directly disposed on the second inorganic layer UIL, and the arrangement is not limited to any one embodiment.

According to an embodiment, the third sensing insulation layer TIL3 may include an organic material.

In an embodiment, among the sensing electrodes TEL and TE2 described with reference to FIG. 6, the first connection patterns CP1 may be included in the first conductive layer TML1. The first sensing patterns SP1, the second sensing patterns SP2, and the second connection patterns CP2 may be included in the second conductive layer TML2. Therefore, the adjacent first sensing patterns SP1 may be connected to the first connection pattern CP1 through a contact hole defined in the second sensing insulation layer TIL2.

In an embodiment and referring to FIG. 7B, the second region A2 has a similar stacked structure with an active region AA on a cross-section. A barrier layer BRL, a buffer layer BFL, and first to sixth insulation layers 10 to 60, respectively, are sequentially stacked on an upper surface of the base layer BL.

In an embodiment, a groove GV may be defined in the second region A2 of the display panel DP. In an embodiment, the groove GV may be formed by passing through the layers from the barrier layer BRL to the fourth insulation layer 40. The groove GV may expose the base layer BL overlapping the second region A2.

In an embodiment, a lower groove GV-1 overlapping the second region A2 is defined in the barrier layer BRL and/or the buffer layer BFL. The lower groove GV-1 is defined in a curvature region CA. The curvature region CA may be defined as a region having a predetermined curvature when the second region A2 is bent about the bending axis AX (see FIG. 4). The width of the base layer BL in a first direction DR1, exposed by the lower groove GV-1, may be smaller than the width of the curvature region CA in the first direction DR1.

In an embodiment, an upper groove GV-2 overlapping the second region A2 is defined in the first to fourth insulation layers 10 to 40, respectively. The upper groove GV-2 is defined in the curvature region CA. An upper surface of the uppermost inorganic layer among the inorganic layers constituting the barrier layer BRL and the buffer layer BFL may be partially exposed from the first to fourth insulation layers 10 to 40, respectively.

In an embodiment, side surfaces of the barrier layer BRL and the buffer layer BFL that define the lower groove GV-1 may each have a predetermined slope on a cross-section. Side surfaces of the first to fourth insulation layers 10 to 40, respectively, that define the upper groove GV-2 may each have a predetermined slope on a cross-section.

According to an embodiment, unlike what is illustrated in FIG. 7B, the width of the upper groove GV-2, corresponding to the fourth insulation layer 40, in the first direction DR1 may be larger than the width of the curvature region CA in the first direction DR1.

In an embodiment, the fifth insulation layer 50, which is an organic layer, is disposed inside the lower groove GV-1 and the upper groove GV-2. The fifth insulation layer 50 is in contact with the upper surface of the base layer BL, the slope of the lower groove GV-1, and the slope of the upper groove GV-2. The fifth insulation layer 50 may be in contact with a portion of the upper surface of the buffer layer BFL exposed from the first to fourth insulation layers 10 to 40, respectively. Since the fifth insulation layer 50 including an organic material is filled in the groove GV defined in the second region A2, the flexibility of the second region A2 is improved.

In an embodiment, at least a portion of a first data line DL1 may be disposed on the fifth insulation layer 50. The first data line DL1 may correspond to any one among the data lines DL1 to DLn described with reference to FIG. 5. The data lines DL1 to DLn may be connected to the pads PD (see FIG. 5) disposed in the third region A3 (see FIG. 5) via the second region A2.

According to an embodiment, the other portion of the first data line DL1 may be disposed on a different layer. For example, the other portion of the first data line DL1 may also be disposed on the fourth insulation layer 40. The one portion and the other portion of the first data line DL1 may be connected to each other through a contact hole passing through the fifth insulation layer 50. This contact hole may be disposed in the non-display region DP-NDA (see FIG. 7A) of the first region A1. The sixth insulation layer 60 protects the first data line DL1 by covering the first data line DL1. The sixth insulation layer 60 may include an organic material.

Figure 8:
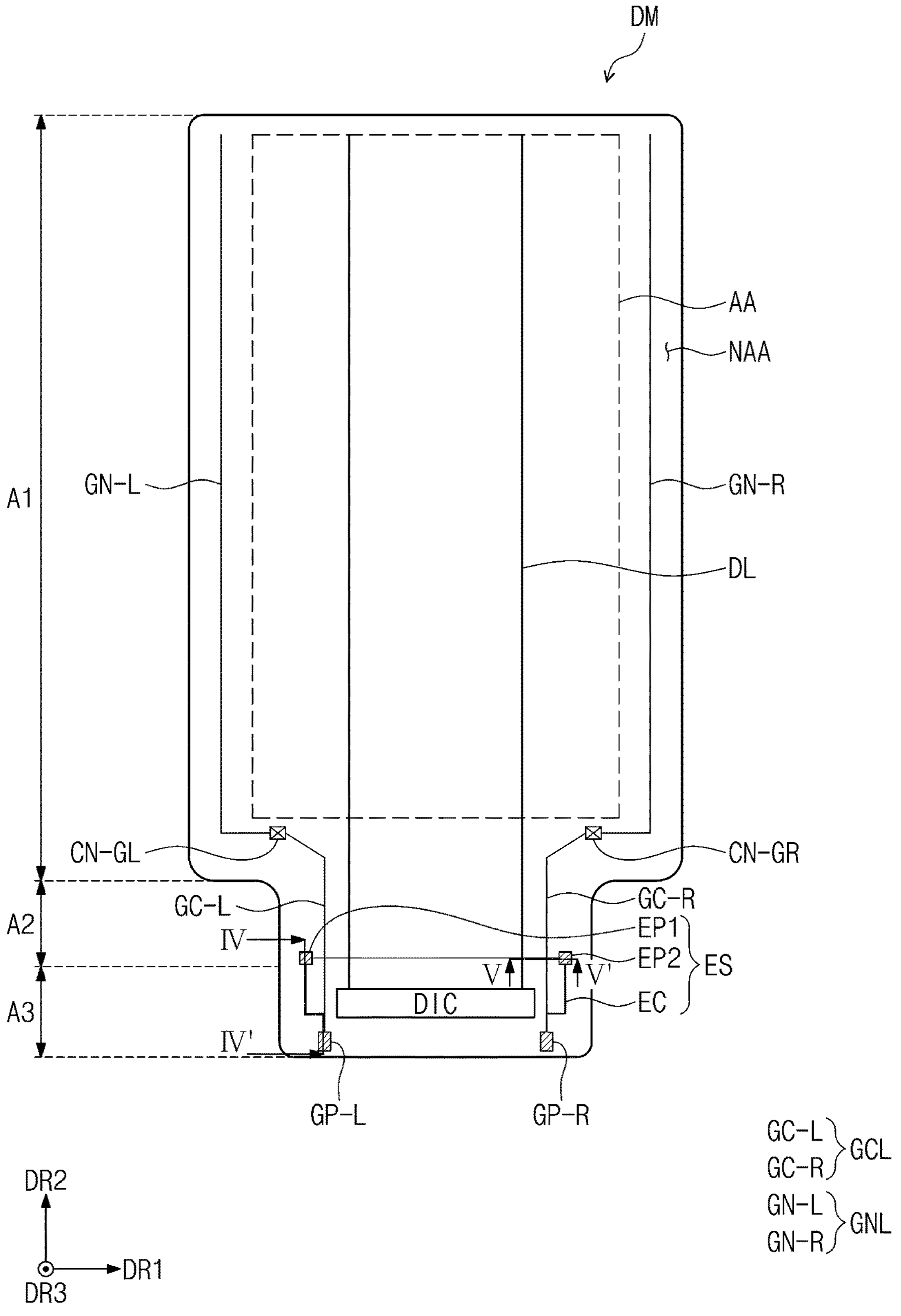
FIG. 8 is a plan view of a display panel, according to an embodiment.
Figure 9A:
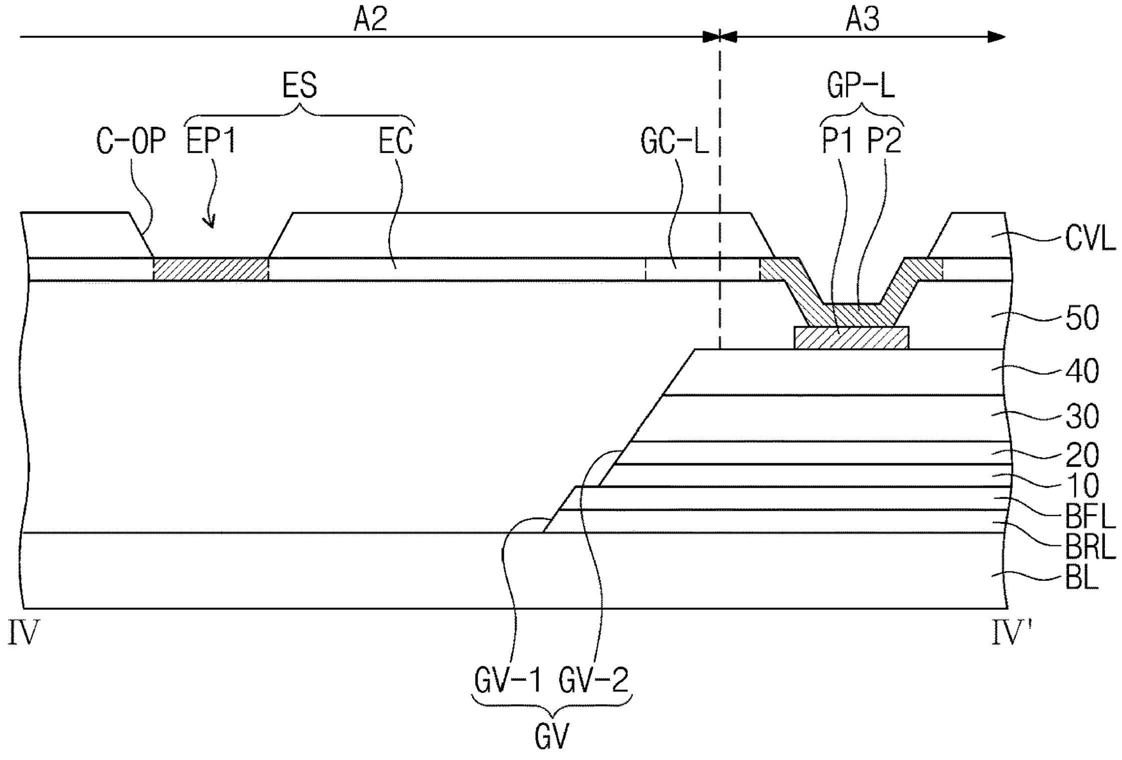
FIG. 9A is a cross-sectional view of the display panel of FIG. 8 taken along line IV-IV' of FIG. 8, according to an embodiment.
Figure 9B:
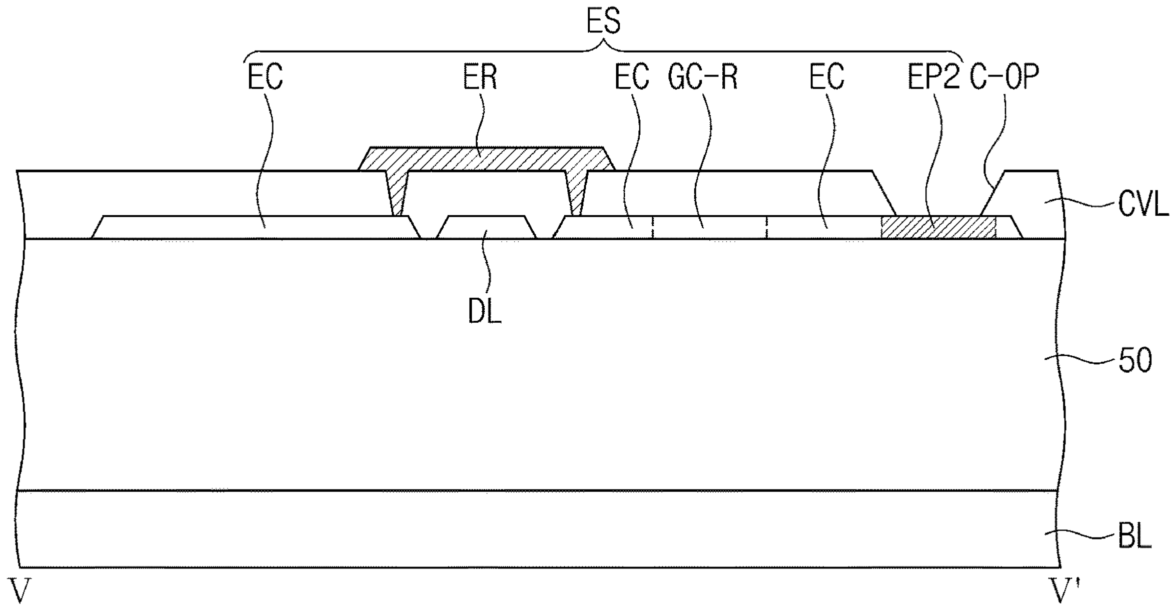
FIG. 9B is a cross-sectional view of the display panel of FIG. 8 taken along line V-V' of FIG. 8, according to an embodiment.

FIG. 8 is a plan view of a display panel, according to an embodiment. FIG. 9A is a cross-sectional view taken along line IV-IV' of FIG. 8, according to an embodiment. FIG. 9B is a cross-sectional view taken along line V-V' of FIG. 8, according to an embodiment.

FIG. 8 illustrates only some of the components included in the display panel DP described with reference to FIG. 5 and included in the input sensor ISP described with reference to FIG. 6.

In an embodiment, data lines DL connected to the pixel PX (see FIG. 5) may extend from a first region A1 to a third region A3 via a second region A2. The data lines DL may be connected to a driving chip DIC disposed in the third region A3 and connected to pixel pads.

In an embodiment, a first ground pattern GN-L included in a ground part GNL may be connected to one end of a first ground line GC-L through a left contact hole CN-GL, and the other end of the first ground line GC-L may be connected to a first ground pad GP-L.

In an embodiment, the left contact hole CN-GL may be defined by the first ground contact hole CN-G1 (see FIG. 5), defined in the display panel DP (see FIG. 5), and a third ground contact hole CN-G3 (see FIG. 6), defined in the input sensor ISP (see FIG. 6), overlapping each other.

In an embodiment, a second ground pattern GN-R included in the ground part GNL may be connected to one end of a second ground line GC-R through a right contact hole CN-GR, and the other end of the second ground line GC-R may be connected to a second ground pad GP-R.

In an embodiment, the right contact hole CN-GR may be defined by the second ground contact hole CN-G2 (see FIG. 5), defined in the display panel DP (see FIG. 5), and a fourth ground contact hole CN-G4 (see FIG. 6), defined in the input sensor ISP (see FIG. 6), overlapping each other.

In an embodiment, a display module DM according to an embodiment may include a shielding part ES. The shielding part ES may be disposed in the second region A2 of the display panel DP. Therefore, the shielding part ES may be bent in correspondence to the second region A2.

In an embodiment, the shielding part ES may include pattern parts EP1 and EP2 and a connection part EC. The pattern parts EP1 and EP2 may be exposed to the outside in the second region A2. The pattern parts EP1 and EP2 may be spaced apart from each other in a first direction DR1. The first pattern part EP1 may be disposed adjacent to the first ground pattern GP-L, and the second pattern part EP2 may be disposed adjacent to the second ground pattern GP-R.

In an embodiment, the connection part EC may connect the pattern parts EP1 and EP2 that are spaced apart from each other. According to an embodiment, one portion of the connection part EC extending from the first pattern part EP1 may be connected to the first ground line GC-L, and the first pattern part EP1 may be connected to the first ground pad GP-L through the one portion of the connection part EC and the first ground line GC-L.

In an embodiment, one portion of the connection part EC extending from the second pattern part EP2 may be connected to the second ground line GC-R, and the second pattern part EP2 may be connected to the second ground pad GP-R through the one portion of the connection part EC and the second ground line GC-R. Accordingly, when a signal is applied to the ground part GNL, the same signal may be provided also to the shielding part ES.

According to an embodiment, the driving chip DIC may be disposed between the ground pads GP-L and GP-R and the pattern parts EP1 and EP2.

FIG. 9A illustrates the connection relationship of the shielding part ES, the first ground line GC-L, and the first ground pad GP-L, according to an embodiment.

In an embodiment and referring to FIG. 9A, the first ground pad GP-L may include a first pattern P1 disposed on a fourth insulation layer 40 and a second pattern P2 overlapping the first pattern P1. The second pattern P2 may be disposed on a pad hole defined on a fifth insulation layer 50, and in contact with the first pattern P1. The pad disposed on the flexible circuit film FCB, described with reference to FIG. 2, may be connected to the second pattern P2.

In this specification, an insulation layer disposed on the uppermost side of the insulation layers disposed in the second region A2 of the display module DM may be defined as a cover part CVL. In an embodiment, the cover part CVL may correspond to a sixth insulation layer 60 described with reference to FIG. 7B. Therefore, the cover part CVL may include an organic material.

In an embodiment, the shielding part ES may be disposed on the fifth insulation layer 50, and at least a portion of the shielding part ES may be covered by the cover part CVL. A first pattern part EP1 and a second pattern part EP2 (see FIG. 9B) of the shielding part ES may be exposed to the outside by an opening C-OP which is defined in the cover part CVL. A connection part EC may be covered by the cover part CVL.

In an embodiment, the shielding part ES may include a conductive material. For example, the shielding part ES may be formed through the same process, and may include the same material, as the process and the material of the first input electrode DE1, the first output electrode SE1, the second input electrode DE2, and the second output electrode SE2 described with reference to FIG. 7A.

According to an embodiment, the shielding part ES and the second pattern P2 may be disposed on the same layer. That is, the shielding part ES and the second pattern P2 may be disposed on the fifth insulation layer 50.

FIG. 9B illustrates an embodiment of the shielding part ES overlapping the data line DL. As described with reference to FIG. 7B, since the data line DL is disposed on the fifth insulation layer 50, the data line DL is disposed on the same layer as a layer on which the shielding part ES is disposed. Therefore, one portion of the connection part EC of the shielding part ES may cross the data line DL on a plane. According to an embodiment, the portion of the connection part EC crossing the data line DL may be disconnected.

The shielding part ES, according to an embodiment, may further include a connection pattern ER. The connection pattern ER may be connected to portions, of the connection part EC, disconnected and spaced apart from each other with the data line DL therebetween. According to an embodiment, an additional cover part, covering the connection pattern ER and disposed in the second region A2, may further be included.

According to an embodiment, static electricity, flowed into the second region A2 from the outside, may be first flowed into the pattern parts EP1 and EP2 that are exposed to the outside, and then emitted to the outside through the connection part EC, the ground lines GC-L and GC-R, the ground pads GP-L and GP-R, and the flexible circuit film FCB (see FIG. 2). Therefore, it may be possible to provide a display device DD (see FIG. 1) with improved electrostatic discharge (ESD) characteristics.

Figure 10:
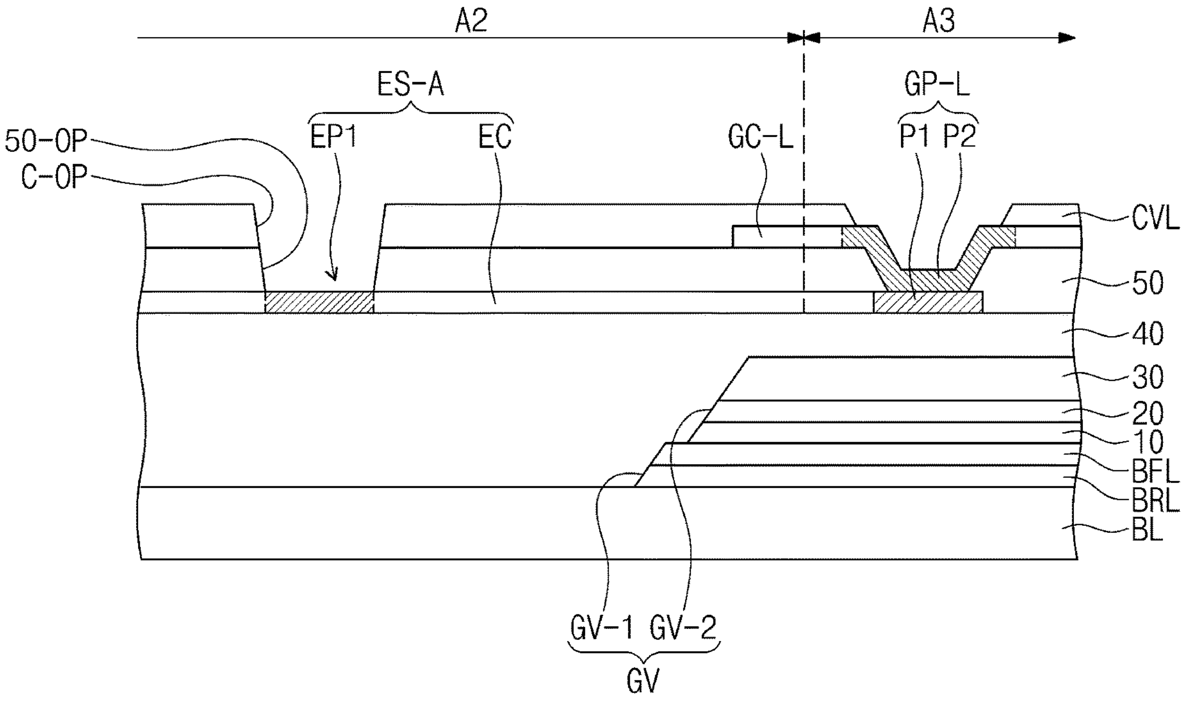
FIG. 10 is a cross-sectional view of a display panel, according to an embodiment.
Figure 11:
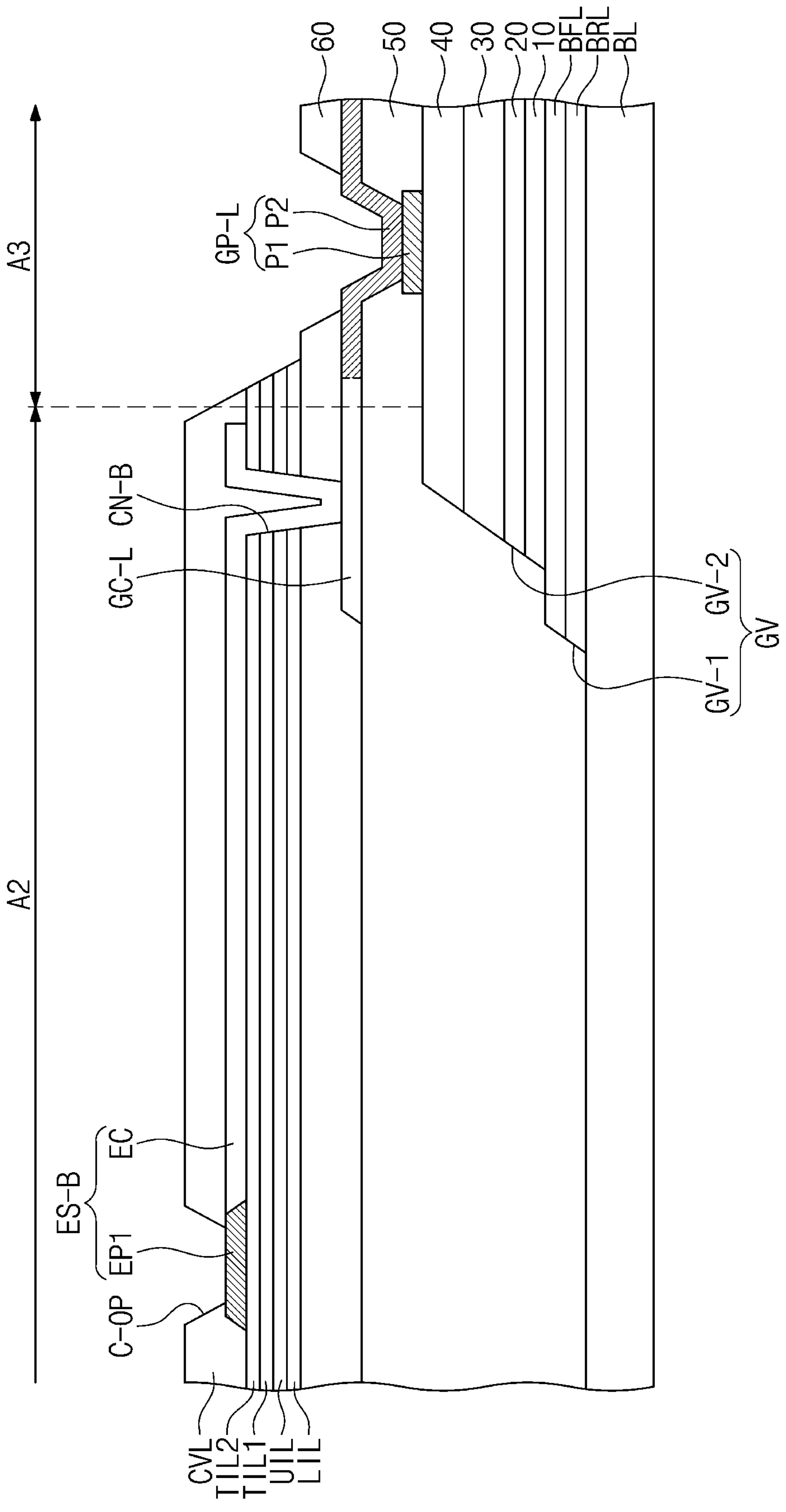
FIG. 11 is a cross-sectional view of a display panel, according to an embodiment.

FIG. 10 is a cross-sectional view of a display panel, according to an embodiment. FIG. 11 is a cross-sectional view of a display panel, according to an embodiment. the same/similar components as the components described with reference to FIGS. 1 to 9B are denoted as the same/similar reference numerals or symbols, and duplicate descriptions are omitted. FIGS. 10 and 11 illustrate a cross-section of a region corresponding to FIG. 9A, according to an embodiment.

In an embodiment and referring to FIG. 10, a ground pad GP-L may include a first pattern P1 disposed on a fourth insulation layer 40 and a second pattern P2 overlapping the first pattern P1. The second pattern P2 may be disposed on a pad hole defined in a fifth insulation layer 50, and in contact with the first pattern P1. The pad disposed on the flexible circuit film FCB described with reference to FIG. 2 may be connected to the second pattern P2.

In an embodiment, a shielding part ES-A may be disposed on the fourth insulation layer 40. The fourth insulation layer 40 may be filled in a groove GV and in contact with a base layer BL. The shielding part ES-A may include a pattern part EP1 and a connection part EC. The pattern part EP1 and the connection part EC may be disposed on the same layer as a layer on which the first pattern P1 is disposed. That is, the shielding part ES-A may be disposed on the fourth insulation layer 40.

According to an embodiment, the pattern part EP1 may be exposed to the outside by a first contact hole 50-OP defined in the fifth insulation layer 50 and an opening C-OP defined in a cover part CVL. The connection part EC may be directly connected to the first pattern P1.

In an embodiment and referring to FIG. 11, a shielding part ES-B may be disposed on a second sensing insulation layer TIL2. The first sensing insulation layer TIL1 and the second sensing insulation layer TIL2 described with reference to FIG. 7A may extend from a first region A1 to a second region A2.

In an embodiment, a pattern part EP1 may be exposed to the outside by an opening C-OP defined in a cover part CVL. The cover part CVL may include an organic material. In an embodiment, the cover part CVL may correspond to the third sensing insulation layer TIL3 described with reference to FIG. 7A. However, an embodiment is not limited thereto, and the cover part CVL is not limited to any one embodiment as long as it has an opening, which exposes the pattern part EP1, defined therein, and including an organic material.

In an embodiment, a connection part EC may be disposed on a contact hole passing through at least one of the first sensing insulation layer TIL1, the second sensing insulation layer TIL2, and a sixth insulation layer 60, and may thus be connected to a ground line GC-L. Therefore, the pattern part EP1 may be connected to a ground pad GP-L through the connection part EC connected to the ground line GC-L.

Figure 12:
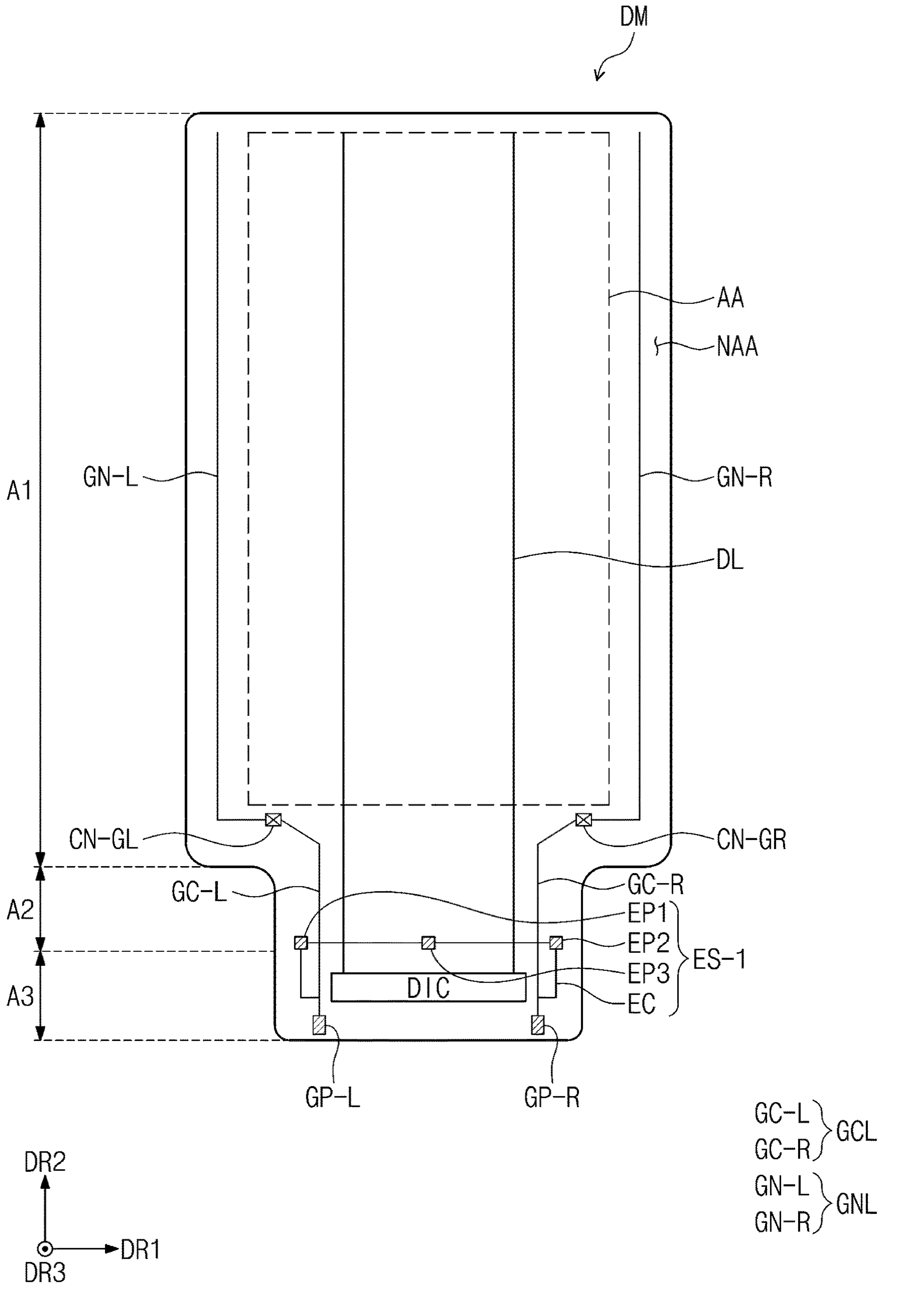
FIG. 12 is a plan view of a display panel, according to an embodiment.
Figure 13:
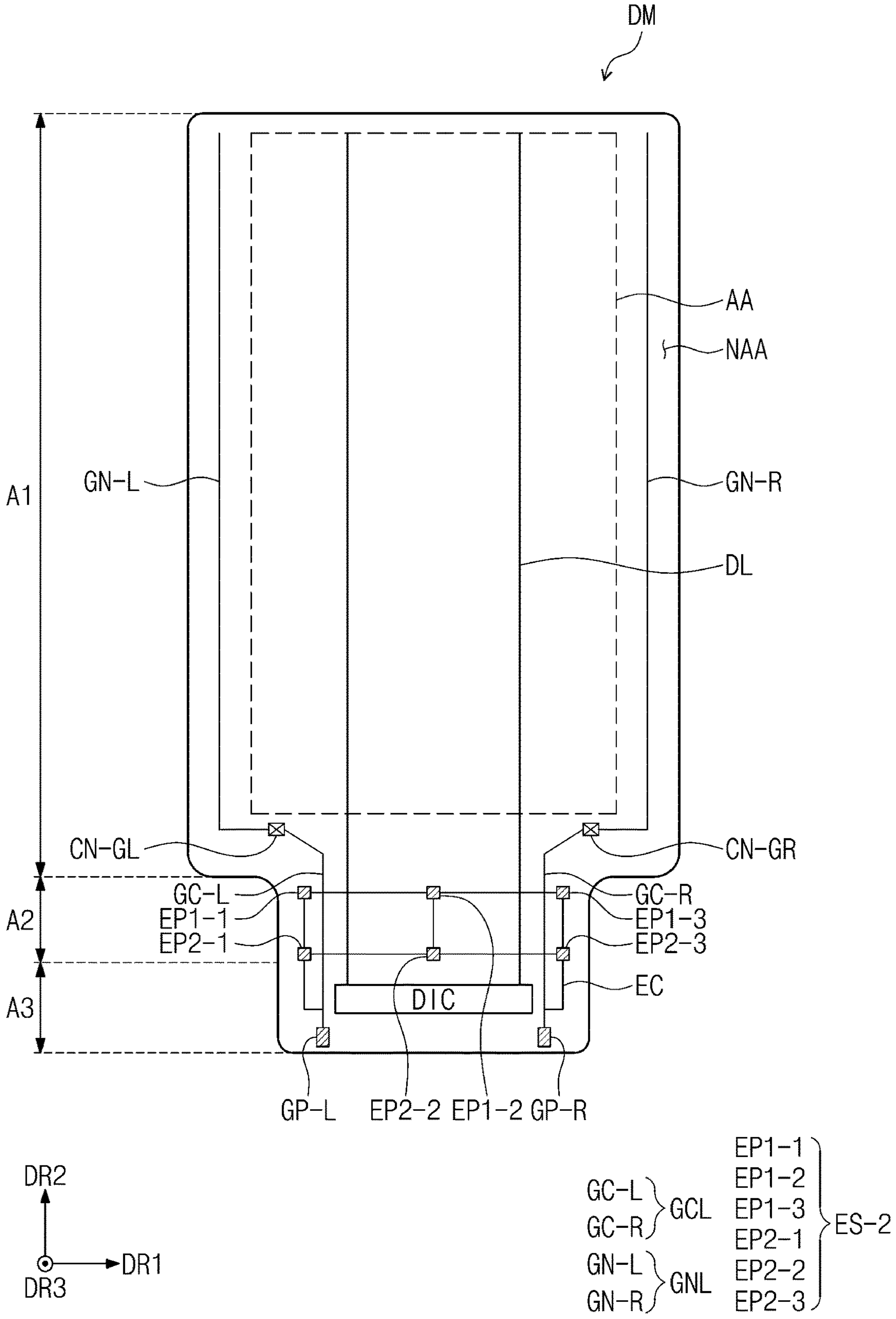
FIG. 13 is a plan view of a display panel, according to an embodiment.
Figure 14:
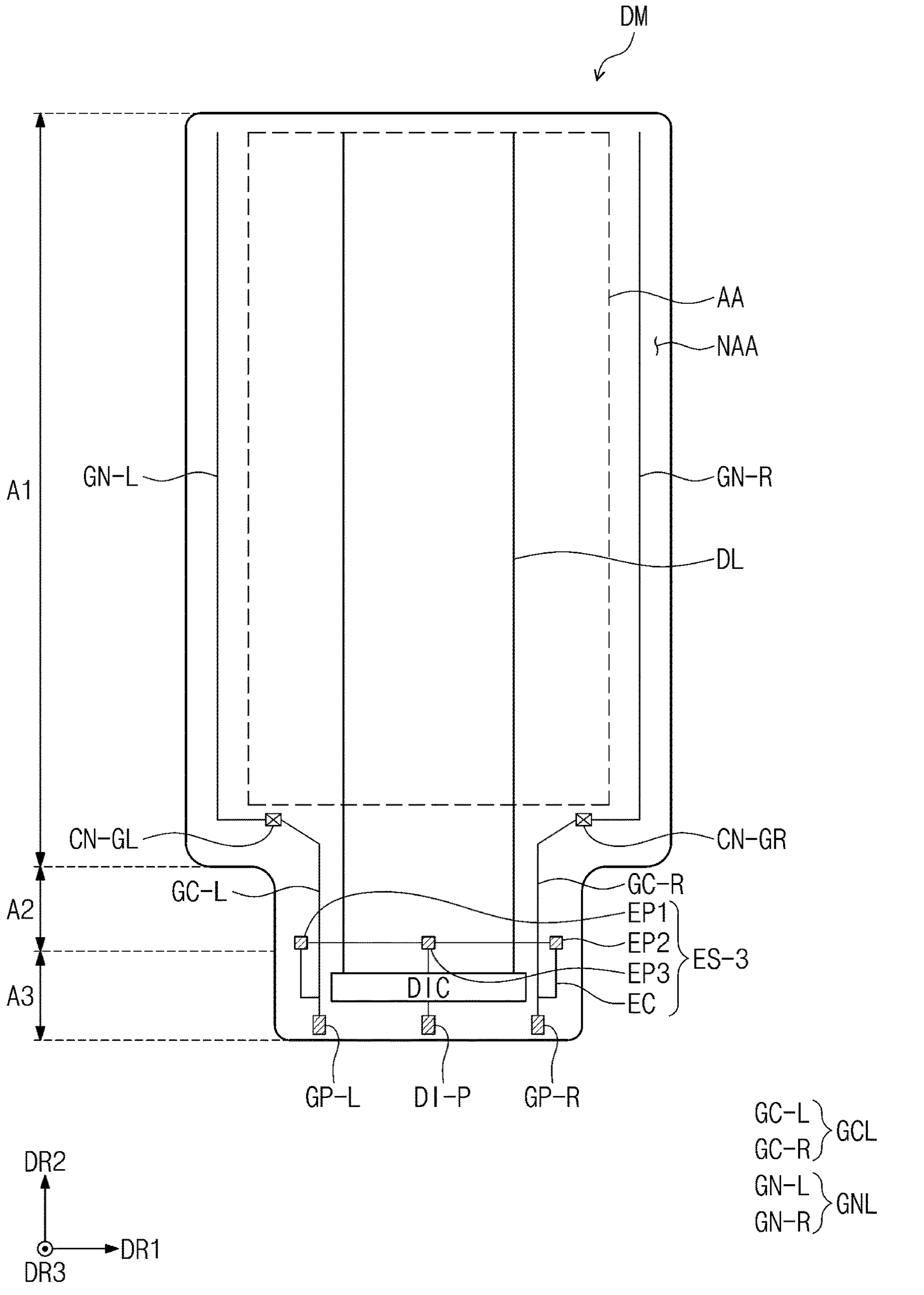
FIG. 14 is a plan view of a display panel, according to an embodiment.
Figure 15:
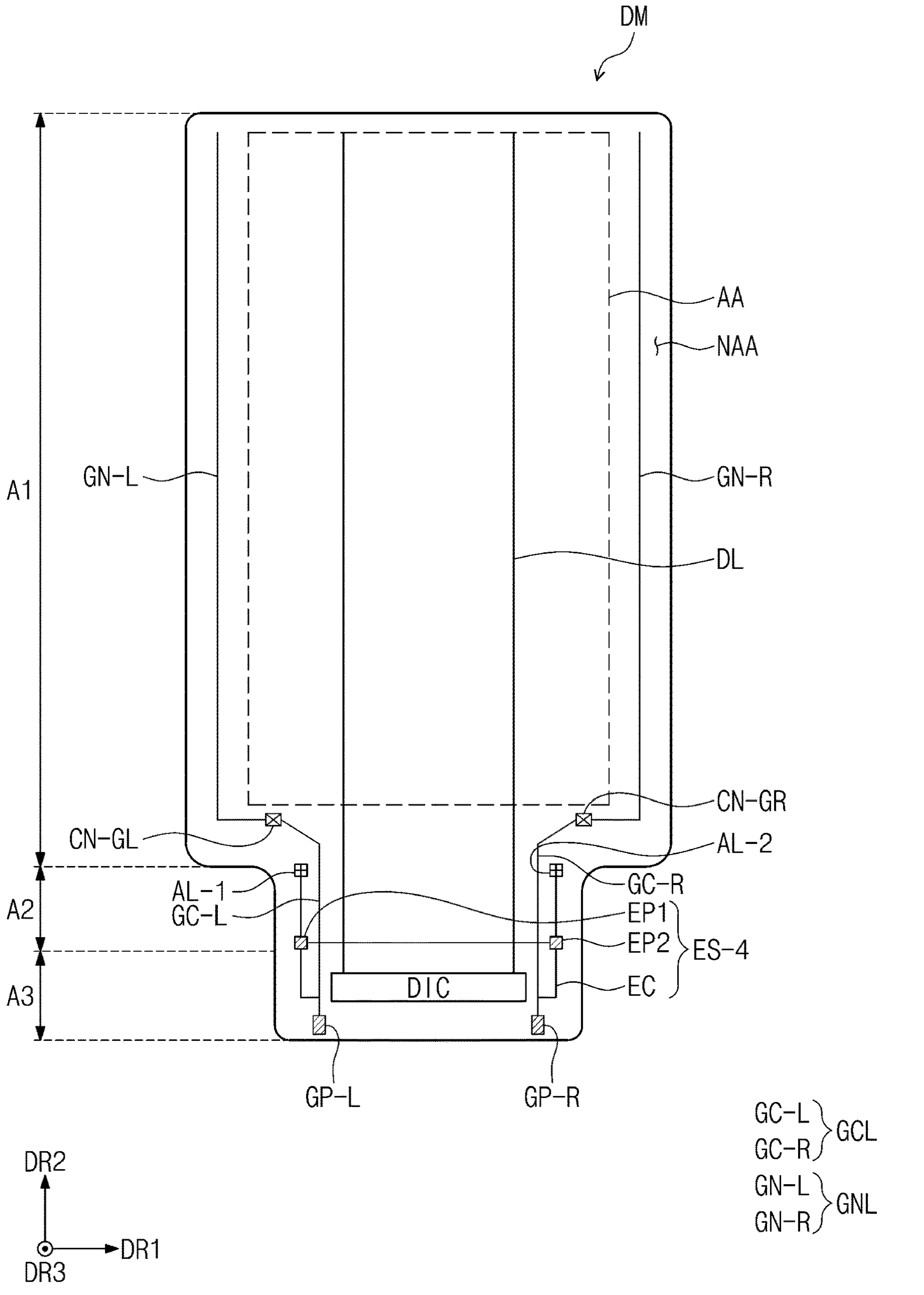
FIG. 15 is a plan view of a display panel, according to an embodiment.

FIG. 12 is a plan view of a display panel, according to an embodiment. FIG. 13 is a plan view of a display panel, according to an embodiment. FIG. 14 is a plan view of a display panel, according to an embodiment. FIG. 15 is a plan view of a display panel, according to an embodiment.

The same/similar components as the components described with reference to FIGS. 1 to 9B are denoted as the same/similar reference numerals or symbols, and duplicate descriptions are omitted. FIGS. 12 to 15 illustrate only some of the components included in the display panel DP described with reference to FIG. 5 and included in the input sensor ISP described with reference to FIG. 6. Descriptions of a data line DL, ground lines GC-L and GC-R, a driving chip DIC, ground pads GP-L and GP-R, and contact holes GC-L and GC-R may correspond to the descriptions with reference to FIG. 8.

In an embodiment and referring to FIG. 12, a shielding part ES-1 may include first to third pattern parts EP1, EP2, and EP3, respectively, and a connection part EC.

In an embodiment, the first to third pattern parts EP1 to EP3, respectively, may be arranged along a first direction DR1. The third pattern part EP3 may be disposed between the first pattern part EP1 and the second pattern part EP2. The third pattern part EP3 may overlap a driving chip DIC when viewed from a second direction DR2.

In an embodiment, the first to third pattern parts EP1 to EP3, respectively, may each be exposed to the outside through the opening C-OP of the cover part CVL described with reference to FIG. 9A.

In an embodiment, the connection part EC may connect the first to third pattern parts EP1 to EP3, respectively, to each other. One portion of the connection part EC extending from the first pattern part EP1 may be connected to a first ground line GC-L, and one portion of the connection part EC extending from the second pattern part EP2 may be connected to a second ground line GC-R.

In an embodiment and referring to FIG. 13, a shielding part ES-2 may include a first group pattern part and a second group pattern part. The first group pattern part and the second group pattern part may be spaced apart from each other along a second direction DR2.

In an embodiment, the first group pattern part may include a (1-1)-th to (1-3)-th pattern parts EP1-1, EP1-2, and EP1-3, respectively.

In an embodiment, the (1-1)-th to (1-3)-th pattern parts EP1-1 to EP1-3, respectively, may be arranged along a first direction DR1. The (1-2)-th pattern part EP1-2 may be disposed between the (1-1)-th pattern part EP1-1 and the (1-3)-th pattern part EP1-3. The (1-2)-th pattern part EP1-2 may overlap a driving chip DIC when viewed from the second direction DR2.

In an embodiment, the second group pattern part may include a (2-1)-th to (2-3)-th pattern parts EP2-1, EP2-2, and EP2-3, respectively.

In an embodiment, the (2-1)-th to (2-3)-th pattern parts EP2-1 to EP2-3, respectively, may be arranged along the first direction DR1. The (2-2)-th pattern part EP2-2 may be disposed between the (2-1)-th pattern part EP2-1 and the (2-3)-th pattern part EP2-3. The (2-2)-th pattern part EP2-2 may overlap the driving chip DIC when viewed from the second direction DR2.

In an embodiment, the (1-1)-th pattern part EP1-1 and the (2-1)-th pattern part EP2-1 may be arranged along the second direction DR2, the (1-2)-th pattern part EP1-2 and the (2-2)-th pattern part EP2-2 may be arranged along the second direction DR2, and the (1-3)-th pattern part EP1-3 and the (2-3)-th pattern part EP2-3 may be arranged along the second direction DR2.

In an embodiment, the pattern parts included in the first group pattern part and the second group pattern part may each be exposed to the outside through the opening C-OP of the cover part CVL described with reference to FIG. 9A. According to an embodiment, at least one of the pattern parts may be covered by the cover part CVL described with reference to FIG. 9A, and the pattern parts are not limited to any one embodiment.

FIG. 13 illustrates the pattern parts arranged in two rows and three columns, but an embodiment is not limited thereto. In an embodiment, the number of the pattern parts exposed from the cover part CVL (see FIG. 9A) and the arrangement thereof may be changed.

In an embodiment, the connection part EC may connect the pattern parts, included in the first group pattern part and the second group pattern part, together. One portion of the connection part EC extending from the (2-1)-th pattern part EP2-1 may be connected to a first ground line GC-L, and one portion of the connection part EC extending from the (2-3)-th pattern part EP2-3 may be connected to a second ground line GC-R.

In an embodiment and referring to FIG. 14, a driving chip DIC may be connected to a driving ground pad DI-P. Static electricity flowed into the driving chip DIC may be emitted to a flexible circuit film FCB through the driving ground pad DI-P.

In an embodiment, a shielding part ES-3 may include first to third pattern parts EP1, EP2, and EP3, respectively, and a connection part EC.

In an embodiment, the first to third pattern parts EP1 to EP3, respectively, may be arranged along a first direction DR1. The third pattern part EP3 may be disposed between the first pattern part EP1 and the second pattern part EP2. The first to third pattern parts EP1 to EP3, respectively, may each be exposed to the outside through the opening C-OP of the cover part CVL described with reference to FIG. 9A.

In an embodiment, a connection part EC may connect the first to third pattern parts EP1 to EP3, respectively, to each other. One portion of the connection part EC extending from the first pattern part EP1 may be connected to a first ground line GC-L, and one portion of the connection part EC extending from the second pattern part EP2 may be connected to a second ground line GC-R.

According to an embodiment, one portion of the connection part EC extending from the third pattern part EP3 may be connected to the driving chip DIC. Therefore, the third pattern part EP3 may be connected to the driving ground pad DI-P through the connection part EC.

In an embodiment and referring to FIG. 15, a display module DM may include alignment marks AL-1 and AL-2 disposed on the display panel DP (see FIG. 5) and may include a conductive material. For example, the alignment marks AL-1 and AL-2 may be disposed on the fourth insulation layer 40 or on the fifth insulation layer 50 described with reference to FIG. 7A. The alignment marks AL-1 and AL-2 may be disposed in a first region A1 located adjacent to a second region A2, but the invention is not limited thereto.

In an embodiment, the alignment marks AL-1 and AL-2 may be used for arrangement of components in a process of bonding the window WM (see FIG. 3), in a process of bonding the optical film OTF (see FIG. 3), in a process of bonding the functional layer MP (see FIG. 4), and in a process of bonding a driving chip DIC.

A shielding part ES-4, according to an embodiment, may include first and second pattern parts EP1 and EP2, respectively, and a connection part EC.

In an embodiment, the first pattern part EP1 and the second pattern part EP2 may be arranged along a first direction DR1. The first to second pattern parts EP1 to EP2, respectively, may each be exposed to the outside through the opening C-OP of the cover part CVL described with reference to FIG. 9A.

In an embodiment, the connection part EC may connect the first to second pattern parts EP1 to EP2, respectively, to each other. One portion of the connection part EC extending from the first pattern part EP1 may be connected to a first ground line GC-L, and one portion of the connection part EC extending from the second pattern part EP2 may be connected to a second ground line GC-R.

According to an embodiment, another portion of the connection part EC extending from the first pattern part EP1 may be connected to the first alignment mark AL-1, and another portion of the connection part EC extending from the second pattern part EP2 may be connected to the second alignment mark AL-2.

According to an embodiment, by including a shielding part which is disposed in a bending region of a display panel and one portion of which is exposed to the outside, it may be possible to provide a display device having improved electrostatic discharge (ESD) characteristics.

Although some embodiments of the invention have been described, it is understood that the invention should not be limited to these embodiments, but various changes and modifications can be made by one ordinary skilled in the art within the spirit and scope of the invention. Therefore, the technical scope of the invention should not be limited to the contents described herein. Moreover, the embodiments or parts of the embodiments may be combined in whole or in part without departing from the scope of the invention.

What is claimed is:

1. A display device comprising:

a display panel including a base layer containing a first region having an active region, a second region bent about a bending axis, and a third region spaced apart from the first region with the second region disposed therebetween, a pixel overlapping the active region, a shielding part disposed in the second region, and pads disposed in the third region;

an input sensor disposed on the display panel and including sensing electrodes overlapping the active region and a ground part disposed in a peripheral region adjacent to the active region; and a flexible circuit film connected to the pads, wherein the ground part is connected to a ground pad among the pads, and wherein the shielding part includes a pattern part exposed to the outside, and a connection part connected to the pattern part and the ground pad.

2. The display device of claim 1, wherein the display panel further comprises a cover part in which an opening exposing the pattern part is defined, and which is disposed in the second region to cover the pattern part, wherein the cover part includes an organic material.

3. The display device of claim 2, wherein the display panel comprises a ground line which is disposed in the first region, the second region and the third region, and which has one end connected to the ground part through a contact hole defined in the first region and the other end connected to the ground pad, wherein the ground part is connected to the ground pad through the ground line.

4. The display device of claim 3, wherein the connection part is connected to the ground pad through the ground line.

5. The display device of claim 4, wherein the display panel further comprises a data line disposed in the first region, the second region and the third region, and is connected to the pixel and a pixel pad among the pads, wherein the connection part crosses the data line on a plane.

6. The display device of claim 5, wherein the shielding part further comprises a connection pattern disposed on a different layer from a layer on which the connection part is disposed, and overlapping a place at which the data line and the connection part cross each other, wherein the connection part is disconnected at the place where the connection part crosses the data line, and wherein portions of the connection part, disconnected and spaced apart from each other with the data line therebetween, are connected by the connection pattern.

7. The display device of claim 3, wherein each of the pads comprises a first pattern and a second pattern disposed on the first pattern, wherein the first pattern and the second pattern are in contact with the flexible circuit film.

8. The display device of claim 7, wherein the shielding part is disposed on a same layer as a layer on which the first pattern is disposed.

9. The display device of claim 7, wherein the shielding part is disposed on a same layer as a layer on which the second pattern is disposed.

10. The display device of claim 3, wherein the input sensor comprises a first sensing insulation layer directly disposed on the display panel, a first conductive layer disposed on the first sensing insulation layer and constituting a part of the sensing electrodes, a second sensing insulation layer covering the first conductive layer and disposed on the first sensing insulation layer, and a second conductive layer disposed on the second sensing insulation layer and constituting a remaining part of the sensing electrodes.

11. The display device of claim 10, wherein the shielding part comprises a same material as that of the second conductive layer, and the connection part is connected to the ground line by passing through at least one of the first sensing insulation layer and the second sensing insulation layer.

12. The display device of claim 1, wherein the pattern part includes a plurality of pattern parts spaced apart from each other, and wherein the connection part is connected to each of the pattern parts.

13. The display device of claim 12, wherein the display panel further comprises a driving chip disposed in the third region, wherein the driving chip is disposed between the pads and the plurality of pattern parts on a plane.

14. The display device of claim 13, wherein the driving chip is connected to a driving ground pad among the pads, and the connection part is connected to the driving ground pad.

15. The display device of claim 1, wherein the display panel further comprises an alignment mark disposed in the first region and including a conductive material.

16. The display device of claim 15, wherein the connection part is connected to the alignment mark.

17. The display device of claim 1, wherein the pixel comprises a semiconductor pattern, a control electrode overlapping the semiconductor pattern, an upper electrode overlapping the control electrode, a transistor including a source and a drain connected to the semiconductor pattern, and a light-emitting element connected to the transistor, wherein the display panel comprises a barrier layer disposed on the base layer, a buffer layer disposed on the barrier layer, a first insulation layer disposed on the buffer layer and covering the semiconductor pattern, a second insulation layer disposed on the first insulation layer and covering the control electrode, a third insulation layer disposed on the second insulation layer and covering the upper electrode, a fourth insulation layer disposed on the third insulation layer and having the source and the drain disposed therein, a fifth insulation layer disposed on the fourth insulation layer and covering the source and the drain, and a sixth insulation layer disposed on the fifth insulation layer.

18. The display device of claim 17, wherein the display panel further comprises a connection electrode connected to the source and the light-emitting element through a contact hole defined in the fifth insulation layer, and covered by the sixth insulation layer.

19. The display device of claim 18, wherein a groove, passing through the first insulation layer, the second insulation layer, the third insulation layer and the fourth insulation layer to expose the base layer, is defined in the second region, and wherein the fifth insulation layer is disposed on the groove.

20. The display device of claim 19, wherein the shielding part is covered by the sixth insulation layer.

* * * * *